US009060092B2

(12) United States Patent
Miwa et al.

(10) Patent No.: US 9,060,092 B2
(45) Date of Patent: Jun. 16, 2015

(54) IMAGE SENSOR MODULE

(71) Applicant: ROHM CO., LTD., Kyoto-shi, Kyoto (JP)

(72) Inventors: Tadatoshi Miwa, Kyoto (JP); Takumi Yamade, Kyoto (JP); Yasuyuki Aritaki, Kyoto (JP); Kuniaki Nakamura, Kyoto (JP); Naoki Sekiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/192,218

(22) Filed: Feb. 27, 2014

(65) Prior Publication Data

US 2014/0198355 A1 Jul. 17, 2014

Related U.S. Application Data

(63) Continuation-in-part of application No. PCT/JP2012/071846, filed on Aug. 29, 2012.

(30) Foreign Application Priority Data

Aug. 31, 2011 (JP) ................................. 2011-188598
Apr. 4, 2012 (JP) ................................. 2012-085732
Aug. 9, 2012 (JP) ................................. 2012-176915

(51) Int. Cl.
*H04N 1/028* (2006.01)
*H04N 1/024* (2006.01)
*H04N 1/031* (2006.01)

(52) U.S. Cl.
CPC .......... *H04N 1/0281* (2013.01); *H04N 1/0318* (2013.01); *H04N 2201/03112* (2013.01); *H04N 2201/03154* (2013.01); *H04N 1/02481* (2013.01); *H04N 1/02835* (2013.01)

(58) Field of Classification Search
USPC ......... 358/474, 475, 482, 484, 497, 498, 509, 358/510; 382/233; 399/202; 348/131; 257/79, 80, 82; 362/555
See application file for complete search history.

(56) References Cited

U.S. PATENT DOCUMENTS 6,357,903 B1 * 3/2002 Furusawa et al. ............. 362/555
6,455,834 B2 * 9/2002 Fujimoto et al. ........... 250/208.1
8,297,822 B2 * 10/2012 Lee et al. ...................... 362/555

(Continued)

FOREIGN PATENT DOCUMENTS

| JP | 6-141131 | 5/1994 |
| JP | 2000-349971 | 12/2000 |
| JP | 2001-251459 | 9/2001 |
| JP | 2003-87502 | 3/2003 |

(Continued)

*Primary Examiner* — Allen H Nguyen
(74) *Attorney, Agent, or Firm* — Hamre, Schumann, Mueller & Larson, P.C.

(57) ABSTRACT

An image sensor module includes a light source unit that emits a linear light beam elongate in a primary scanning direction to an object to be read, and a lens unit including an incidence surface and an output surface oriented opposite to each other. The lens unit is configured to receive light from the object through the incidence surface and output the light through the output surface. The module also includes a sensor IC that receives the light outputted from the output surface, a housing that holds the light source unit and the lens unit, and a support member that supports the lens unit such that the incidence surface is located more distant from the sensor IC than the output surface in a secondary scanning direction. The support member includes a reflection surface that reflects the light from the object toward the incidence surface.

32 Claims, 28 Drawing Sheets

(56) References Cited

U.S. PATENT DOCUMENTS 8,379,275 B2 * 2/2013 Tahk et al. .................. 358/475
2007/0285740 A1 12/2007 Onishi et al.

FOREIGN PATENT DOCUMENTS

| JP | 2007-300536 | 11/2007 |
| WO | WO 2006/132186 | 12/2006 |

* cited by examiner

FIG.4
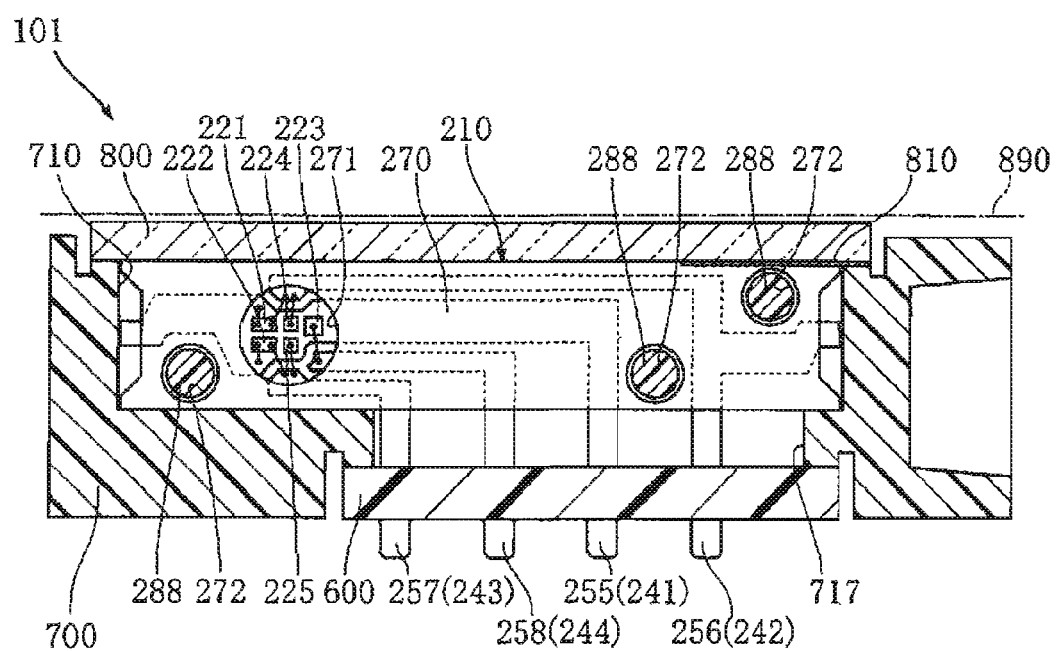
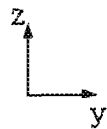

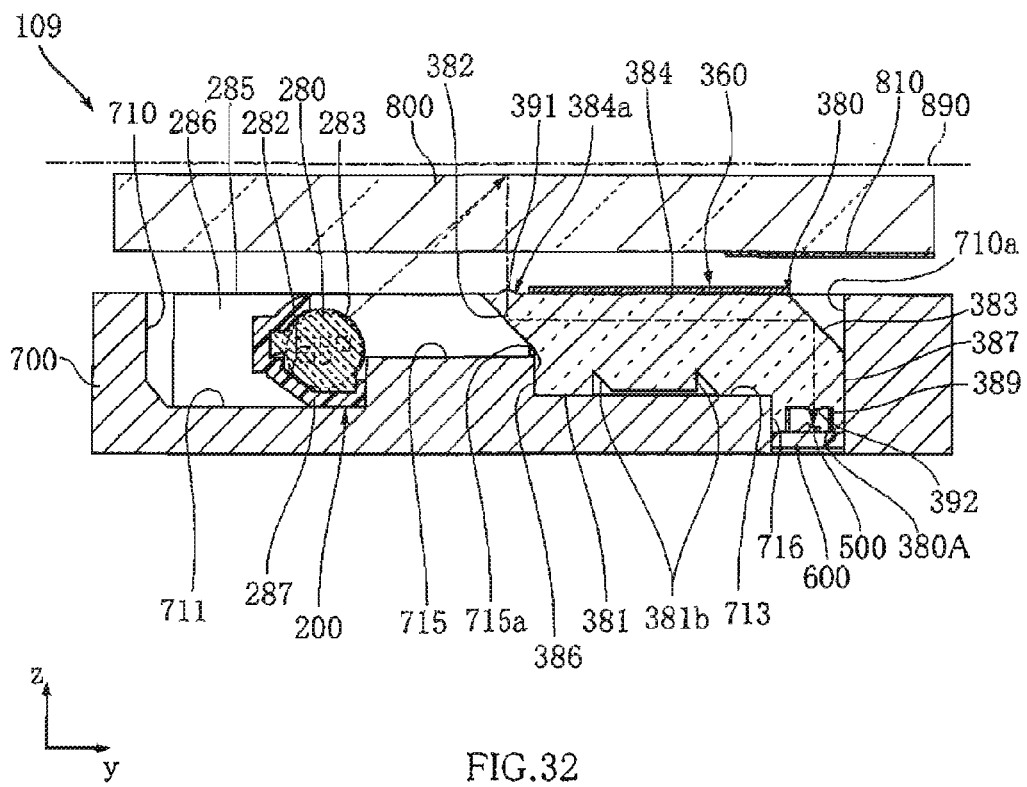
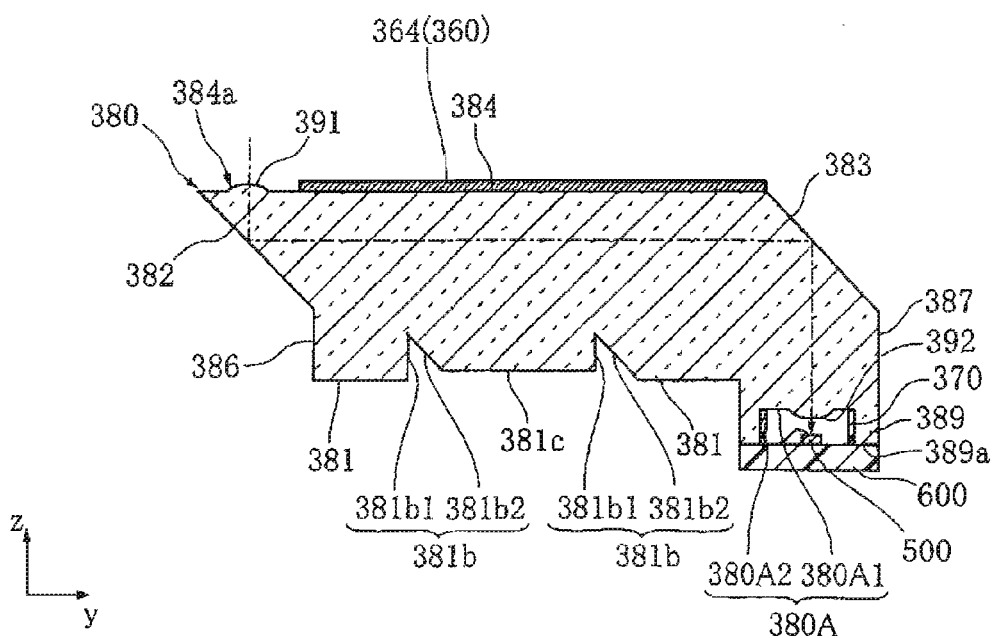

FIG.35
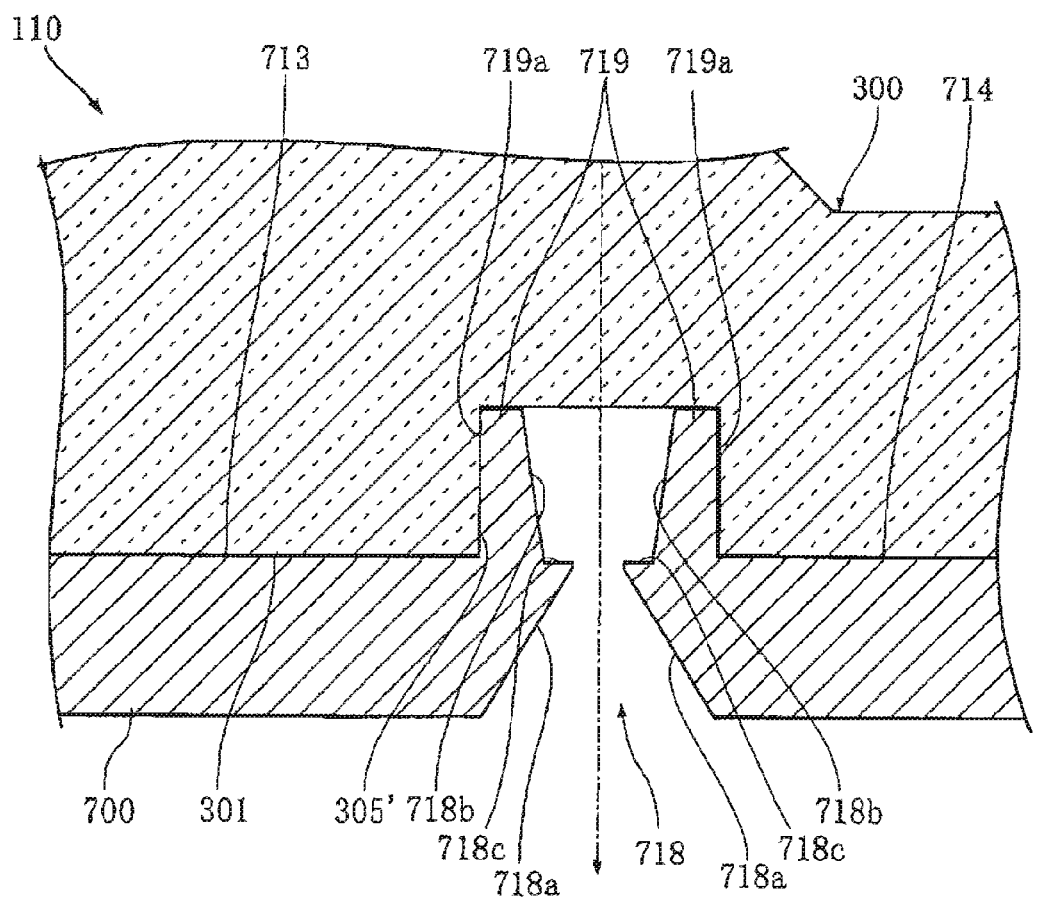
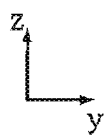

IMAGE SENSOR MODULE

TECHNICAL FIELD

The present invention relates to an image sensor module used for example in a document scanner.

BACKGROUND ART

FIG. 38 illustrates an example of conventional image sensor modules. The image sensor module 900 shown in FIG. 38 serves to read a written content of an object to be read 890 transported in a secondary scanning direction y, as image data. The image sensor module 900 includes a housing 91, a substrate 92, an LED module 93, a light guide 94, a lens unit 95, a sensor IC 96, and a transmission plate 97. The housing 91 has an elongate shape extending in a primary scanning direction orthogonal to the secondary scanning direction y and a thickness direction z. The substrate 92 has an elongate rectangular shape extending in the primary scanning direction, and is fitted in the housing 91. The LED module 93 includes a plurality of LED chips 93a, and is located close to an end portion of the housing 91 in the primary scanning direction.

The light guide 94 serves to emit the light from the LED module 93 toward the object to be read 890, and is formed of a transparent resin material. The light guide 94 has an elongate shape extending in the primary scanning direction, and includes an incidence surface (not shown), a reflection surface 94a, and an output surface 94b. The incidence surface is an end face of the light guide 94 in the primary scanning direction and configured to face the LED chips 93a. The reflection surface 94a serves to reflect the light from the incidence surface. The output surface 94b has an elongate shape extending in the primary scanning direction, and serves to output the light that has proceeded through inside the light guide 94 to the object to be read 890, in a form of a linear light beam extending in the primary scanning direction. The light outputted from the light guide 94 is emitted to the object to be read 890 through the transmission plate 97, and reflected by the object to be read 890. The reflected light is converged into the sensor IC 96 by the lens unit 95. The sensor IC 96 is capable of outputting a signal based on the amount of received light. The written content of the object to be read 890 can be read as an image, by storing the signals from the sensor IC 96 in a non-illustrated memory.

When the object to be read 890 is creased or wrinkled, the object to be read 890 is prone to be lifted from the transmission plate 97. To form a clear image of the written content of the object to be read 890 in the sensor IC 96 under such a condition, it is advantageous to prolong the optical path between the object to be read 890 and the sensor IC 96. However, locating the sensor IC 96 at a lower position in order to prolong the optical path results in an increase in size of the image sensor module 900 in a thickness direction z. Such an increase in size makes it difficult to properly incorporate the image sensor module 900 in a related device, such as a document scanner.

Accordingly, the optical path length may be prolonged by placing a reflecting mirror in the housing 91 thereby bending the optical path. By bending optical path, the optical path can be prolonged by moving the sensor IC 96 in a horizontal direction, instead of moving the sensor IC 96 to a lower position. Therefore, the housing 91 can be formed with a reduced thickness. In this case, however, a cavity has to be provided inside the housing 91 for allowing the light to pass, which leads to a decline in rigidity of the housing 91, even though the housing 91 can be made thinner.

DOCUMENT LIST

Patent Document

Document 1: Japanese Patent Publication No. 2007-300536

SUMMARY OF INVENTION

Technical Problem

The present invention has been proposed in view of the foregoing situation. An object of the present invention is to provide a thin image sensor module without compromising the rigidity.

Solution to Problem

According to a first aspect of the present invention, there is provided an image sensor module including: a light source unit that emits a linear light beam elongate in a primary scanning direction to an object to be read; a lens unit including an incidence surface and an output surface oriented opposite to each other, the lens unit being configured to receive light from the object through the incidence surface and output the light through the output surface; a sensor IC that receives the light outputted from the output surface; a housing that holds the light source unit and the lens unit; and a support member that supports the lens unit such that the incidence surface is located more distant from the sensor IC than the output surface in a secondary scanning direction. The support member includes a primary reflection surface that reflects the light from the object toward the incidence surface.

In a preferred embodiment, the reflection surface is located so as to overlap the lens unit as viewed in the secondary scanning direction.

In a preferred embodiment, the lens unit is supported such that an optical axis of the lens unit is aligned with the secondary scanning direction.

In a preferred embodiment, the support member includes a bottom face perpendicular to a thickness direction orthogonal to both of the primary scanning direction and the secondary scanning direction, and the housing includes a support region provided with a support surface held in contact with the bottom face.

In a preferred embodiment, the support member includes: a transmissive portion provided with a primary sloped surface inclined so as to be closer to the light source unit in the secondary scanning direction as proceeding away from the bottom face in the thickness direction; and a non-transmissive layer formed so as to cover the sloped surface; and the reflection surface is located at an interface between the transmissive portion and the non-transmissive layer.

In a preferred embodiment, the transmissive portion is formed integrally with the lens unit so as to cover the lens unit.

In a preferred embodiment, the housing includes an elevated portion protruding in the thickness direction from the support surface, and the elevated portion is in contact with the non-transmissive layer.

In a preferred embodiment, the support region includes a groove penetrating therethrough in the thickness direction, the groove being formed at a position overlapping the sensor IC as viewed in the thickness direction, and the support member includes an additional reflection surface formed so as to overlap the sensor IC as viewed in the thickness direction.

In a more preferred embodiment, the transmissive portion includes: an additional sloped surface formed opposite to the primary sloped surface in the secondary scanning direction and inclined so as to be closer to the light source unit as proceeding away from the bottom face in the thickness direction; and an additional non-transmissive layer formed so as to cover the additional sloped surface, and the additional reflection surface is located at the interface between the additional sloped surface and the additional non-transmissive layer.

In a preferred embodiment, the housing has a thickness direction orthogonal to both of the primary scanning direction and the secondary scanning direction, the housing supporting the support member. The support member includes a bottom face held in contact with the housing and a primary upright surface erected from the bottom face and extending in the primary scanning direction. The reflection surface is inclined with respect to the upright surface.

In a preferred embodiment, the upright surface is in contact with the housing.

In a preferred embodiment, the support member includes an additional upright surface erected from the bottom face and extending in the primary scanning direction, and the additional upright surface is located opposite to the primary upright surface across the lens unit in the secondary scanning direction.

In a preferred embodiment, the support member includes a recessed portion extending in the primary scanning direction and recessed away from the sensor IC, and the housing includes a pair of wall portions extending in the primary scanning direction and fitted in the recessed portion, and a slit formed between the pair of wall portions and facing the sensor IC.

Preferably, the slit includes a pair of primary sloped surfaces extending in the primary scanning direction and inclined so as to be more distant from each other in the secondary scanning direction as proceeding toward the sensor IC in a thickness direction orthogonal to both of the primary scanning direction and the secondary scanning direction.

Preferably, the slit includes a pair of additional sloped surfaces extending in the primary scanning direction and inclined so as to be closer to each other in the secondary scanning direction as proceeding toward the sensor IC in the thickness direction orthogonal to both of the primary scanning direction and the secondary scanning direction, and the pair of additional sloped surfaces is located more distant from the sensor IC than the pair of primary sloped surfaces in the thickness direction.

Preferably, the slit includes a pair of horizontal surfaces extending in the primary scanning direction and perpendicular to the thickness direction, and each of the horizontal surfaces is located between one of the pair of primary sloped surfaces and one of the pair of additional sloped surfaces.

In a preferred embodiment, the sensor IC includes a photodetecting surface perpendicular to the thickness direction, and the pair of horizontal surfaces is oriented in a same direction as the photodetecting surface.

In a preferred embodiment, the sensor IC includes a photodetecting surface perpendicular to the thickness direction, and the pair of horizontal surfaces is configured to face the photodetecting surface.

In a preferred embodiment of the present invention, the housing includes a slit facing the sensor IC, and the support member includes a projecting portion extending into the slit.

In a preferred embodiment of the present invention, the image sensor module further includes a sensor IC support base supporting the sensor IC and fixed to the support member.

Preferably, the support member includes a recessed portion in which the sensor IC is placed.

Preferably, an anti-reflection member is provided inside the recessed portion.

In a preferred embodiment, the support member includes an additional reflection surface that reflects the light from the output surface, and the lens unit is located between the primary reflection surface and the additional reflection surface in the secondary scanning direction.

In a more preferred embodiment of the present invention, a light shielding member is provide for covering the support member in a manner such that at least the reflection surface is exposed.

Preferably, the housing has a thickness direction orthogonal to both of the primary scanning direction and the secondary scanning direction and supports the support member, the support member includes a bottom face supported by the housing and a primary sloped surface inclined with respect to the bottom face, the light shielding member includes a sloped surface anti-reflection portion held in close contact with a part of the sloped surface, and the reflection surface is a portion uncovered with the sloped surface anti-reflection portion of the sloped surface and an interface with air.

Preferably, the light shielding member includes a bottom face anti-reflection portion held in close contact with the bottom face.

Preferably, the support member includes a top face opposite to the bottom face in the thickness direction, and the light shielding member includes a top face cover portion that covers the top face.

Preferably, the support member includes an additional sloped surface inclined with respect to the bottom face, the lens unit is located between the primary sloped surface and the additional sloped surface in the secondary scanning direction, and the light shielding member includes an additional sloped surface anti-reflection portion disposed in close contact with a part of the additional sloped surface.

According to a second aspect of the present invention, there is provided an image sensor module including: a light source unit that emits a linear light beam elongate in a primary scanning direction to an object to be read; a lens unit including an incidence surface and an output surface oriented opposite to each other and configured to receive light from the object through the incidence surface and output the light through the output surface; a sensor IC that receives the light outputted from the output surface; a housing that holds the light source unit and the lens unit; and a support member that supports the lens unit such that the incidence surface is located more distant from the sensor IC than the output surface in a secondary scanning direction. The support member includes a reflection surface that reflects the light from the object toward the sensor IC.

In a preferred embodiment, the reflection surface is located so as to overlap the lens unit as viewed in the secondary scanning direction.

In a preferred embodiment, the lens unit is supported such that an optical axis of the lens unit is aligned with the secondary scanning direction.

In a preferred embodiment, the support member includes a bottom face perpendicular to a thickness direction orthogonal to both of the primary scanning direction and the secondary scanning direction, and the housing includes a support region provided with a support surface held in contact with the bottom face.

In a preferred embodiment, the support region includes a groove penetrating therethrough in the thickness direction, the groove being formed at a position overlapping the sensor IC as viewed in the thickness direction, and the reflection surface is located so as to overlap the groove as viewed in the thickness direction.

In a preferred embodiment, the support member includes a transmissive portion provided with a primary sloped surface inclined so as to be closer to the light source unit in the secondary scanning direction as proceeding away from the bottom face in the thickness direction, and a non-transmissive layer formed so as to cover the sloped surface, and the reflection surface is located at an interface between the transmissive portion and the non-transmissive layer.

In a preferred embodiment, the transmissive portion is formed integrally with the lens unit so as to cover the lens unit.

In a more preferred embodiment, an additional reflection surface is provided for reflecting the light from the object toward the incidence surface.

More preferably, the transmissive portion includes: an additional sloped surface formed opposite to the primary sloped surface in the secondary scanning direction and inclined so as to be closer to the light source unit as proceeding away from the bottom face in the thickness direction; and an additional non-transmissive layer formed so as to cover the additional sloped surface, and the additional reflection surface is located at the interface between the additional sloped surface and the additional non-transmissive layer.

More preferably, the housing includes an elevated portion protruding in the thickness direction from the support surface, and the elevated portion is in contact with the additional non-transmissive layer.

In a preferred embodiment of the present invention, the support member includes a recessed portion extending in the primary scanning direction and recessed away from the sensor IC, and the housing includes a pair of wall portions extending in the primary scanning direction and fitted in the recessed portion, and a slit formed between the pair of wall portions and facing the sensor IC.

Preferably, the slit includes a pair of primary sloped surfaces extending in the primary scanning direction and inclined so as to be more distant from each other in the secondary scanning direction as proceeding toward the sensor IC in the thickness direction orthogonal to both of the primary scanning direction and the secondary scanning direction.

Preferably, the slit includes a pair of additional sloped surfaces extending in the primary scanning direction and inclined so as to be closer to each other in the secondary scanning direction as proceeding toward the sensor IC in the thickness direction orthogonal to both of the primary scanning direction and the secondary scanning direction, and the pair of additional sloped surfaces is located more distant from the sensor IC than the pair of primary sloped surfaces in the thickness direction.

Preferably, the slit includes a pair of horizontal surfaces extending in the primary scanning direction and perpendicular to the thickness direction, and each of the horizontal surfaces is located between one of the pair of primary sloped surfaces and one of the pair of additional sloped surfaces.

In a preferred embodiment, the sensor IC includes a photodetecting surface perpendicular to the thickness direction, and the pair of horizontal surfaces is oriented in a same direction as the photodetecting surface.

In a preferred embodiment, the sensor IC includes a photodetecting surface perpendicular to the thickness direction, and the pair of horizontal surfaces is configured to face the photodetecting surface.

In a preferred embodiment of the present invention, the housing includes a slit facing the sensor IC, and the support member includes a projecting portion extending into the slit.

According to an embodiment of the first or second aspect of the present invention, preferably, the support member includes a cavity elongate in the primary scanning direction, and the lens unit is fitted in the cavity.

According to an embodiment of the first or second aspect of the present invention, preferably, the support member includes a recessed portion formed so as to recede in the thickness direction orthogonal to both of the primary scanning direction and the secondary scanning direction, and the lens unit is fitted in the recessed portion.

According to an embodiment of the first or second aspect of the present invention, more preferably, the image sensor module further includes a substrate on which the sensor IC is mounted. The light source unit includes: an LED module provided with at least one LED chip, at least one lead on which the LED chip is mounted, and a resin package covering a part of the lead and including an opening through which the LED chip is exposed; and a light guide elongate in the primary scanning direction as a whole and including an incidence surface facing the opening, a reflection surface that reflects light from the incidence surface, and an output surface that outputs the light from the reflection surface in a form of a linear light beam elongate in the primary scanning direction. The lead includes a terminal portion sticking out through the resin package in the thickness direction, extending from a position retracted in the secondary scanning direction with respect to the opening.

Preferably, the substrate and at least a part of the light guide are deviated from each other as viewed in the secondary scanning direction.

With the above arrangements, since the reflection surface is provided on the light path extending from the objected to be read to the sensor IC, the light can be properly conducted along the desired path. Thus, it is possible, for example, to align the optical axis of the lens unit along the secondary scanning direction. As a result, in the image sensor module of the present invention, the length in the secondary scanning direction can be increased, thereby increasing the total length of the optical path, while the thickness of the module can be reduced. In addition, by fitting the plate-like support member in the housing, the overall rigidity can be increased, while the thickness of the image sensor module can be reduced.

According to a third aspect of the present invention, there is provided an image sensor module including: a light source unit that emits a linear light beam elongate in a primary scanning direction to an object to be read; a light guide member including an entrance portion facing the object, a primary reflection surface that reflects light from the entrance portion, and an output portion spaced from the entrance portion in a secondary scanning direction; a sensor IC that receives the light from the object through the light guide member; and a housing that holds the light source unit and the light guide member. The entrance portion includes an entrance lens surface, and the output portion includes an output lens surface.

Preferably, a substrate is provided for supporting the sensor IC and fixed to the light guide member.

Preferably, the light guide member includes an additional reflection surface spaced from the primary reflection surface in the secondary scanning direction.

Other features and advantages of the present invention will become more apparent through detailed description given hereunder with reference to the accompanying drawings.

BRIEF DESCRIPTION OF DRAWINGS

FIG. 4 is a cross-sectional view taken along a line VI-VI in FIG. 2.

FIG. 31 is a cross-sectional view showing an image sensor module according to a ninth embodiment of the present invention.

FIG. 32 is an enlarged cross-sectional view showing a light guide member shown in FIG. 31.

FIG. 35 is an enlarged cross-sectional view showing a slit shown in FIG. 34.

EMBODIMENTS TO CARRY OUT INVENTION

Figure 1:
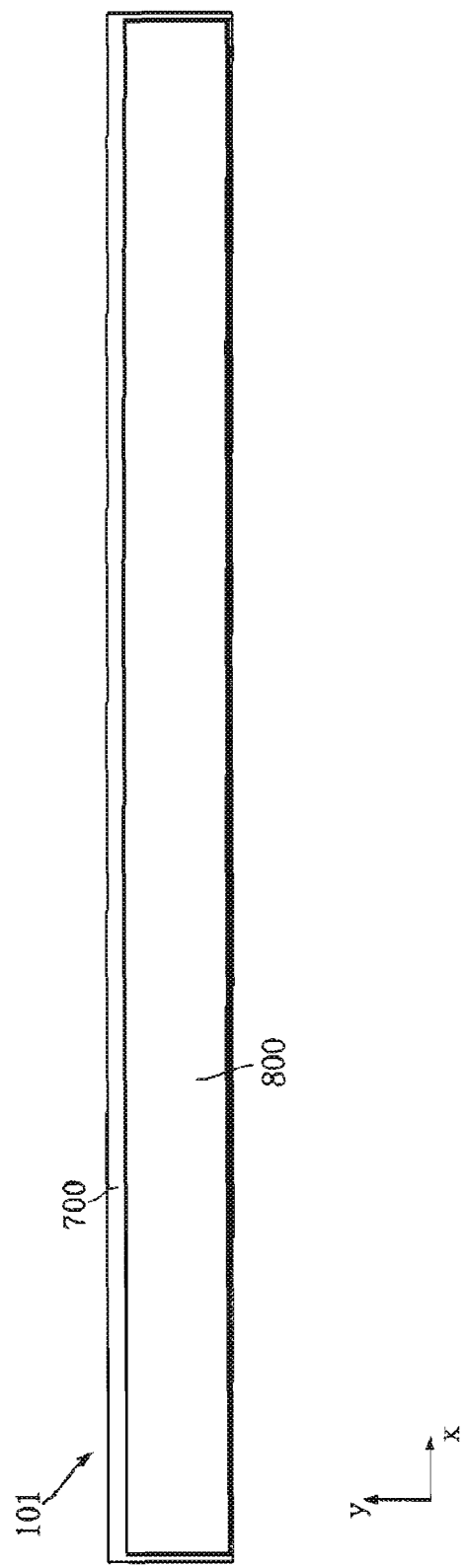
FIG. 1 is a plan view showing an image sensor module according to a first embodiment of the present invention.

Preferred embodiments of the present invention will be described below referring to the drawings.

Figure 2:
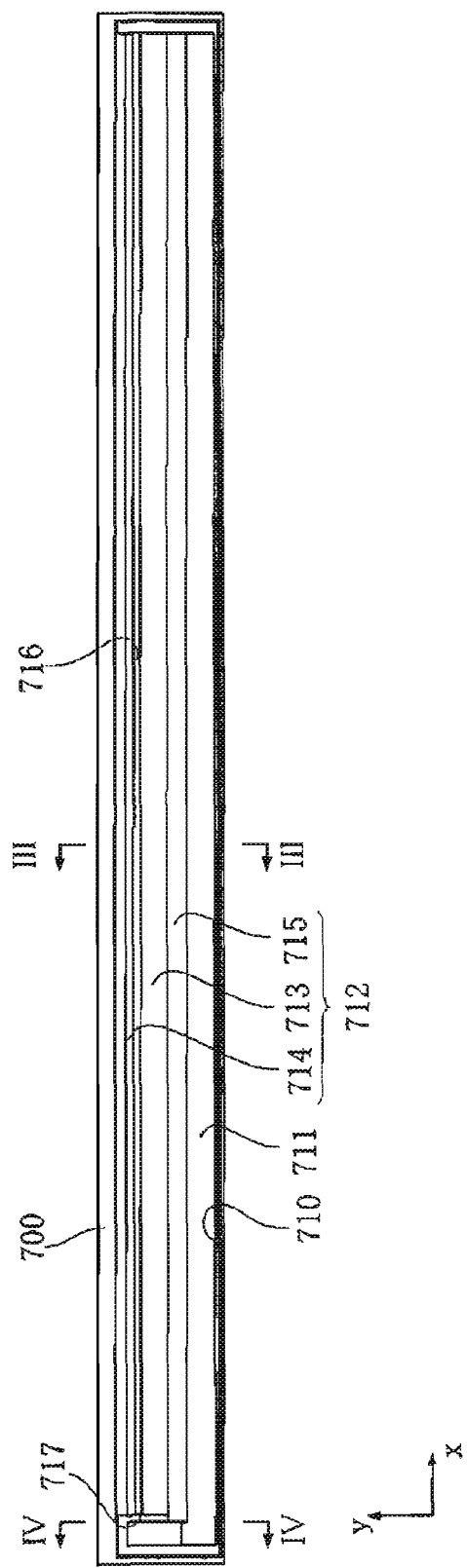
FIG. 2 is a plan view showing a housing employed in the image sensor module shown in FIG. 1.
Figure 3:
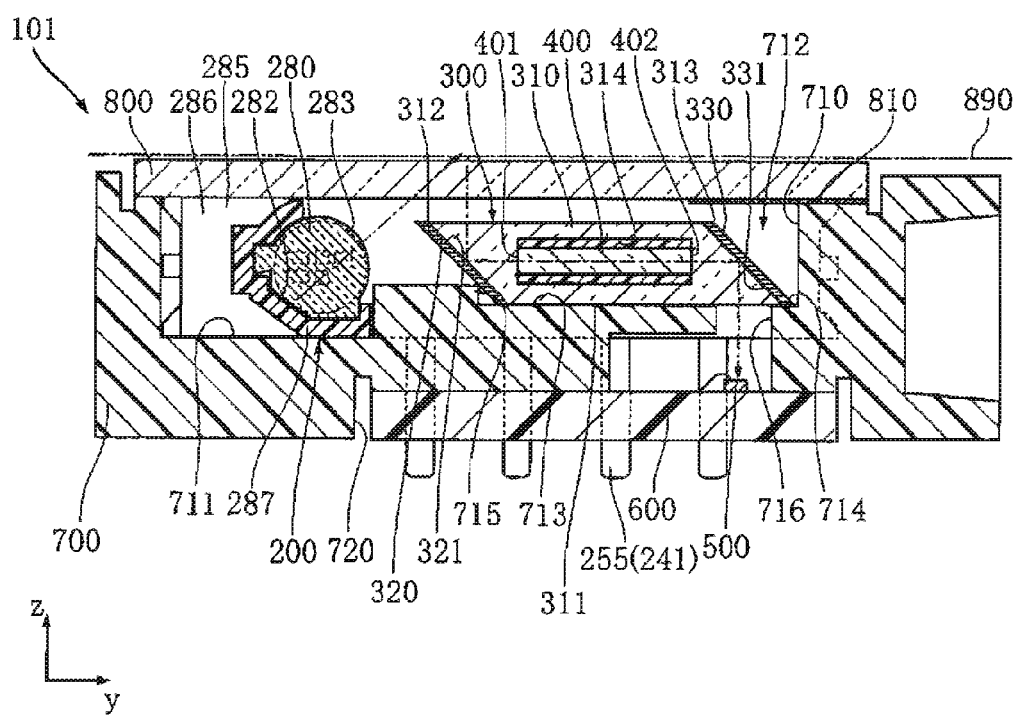
FIG. 3 is a cross-sectional view taken along a line III-III in FIG. 2.

FIGS. 1, 3, and 4 illustrate an image sensor module according to a first embodiment of the present invention. The image sensor module 101 according to this embodiment includes a light source unit 200, a support member 300, a lens unit 400, a sensor IC 500, a substrate 600, a housing 700, and a transmission plate 800. FIG. 2 is a plan view showing the housing 700. FIGS. 3 and 4 are cross-sectional views of the image sensor module 101, and the positions of the respective cutting lines are indicated in FIG. 2. The image sensor module 101 may be incorporated, for example, in a document scanner designed to optically read characters and images printed on an object 890 to be read and generate electronic data containing those characters and images.

The housing 700 defines the outer shape of the image sensor module 101, and encloses and supports the relevant components. The housing 700 has a thickness direction z orthogonal to both of a primary scanning direction x and a secondary scanning direction y. The housing 700 has an elongate shape extending in the primary scanning direction x, and has a generally rectangular cross-sectional shape taken in the secondary scanning direction y and the thickness direction z. The housing 700 may be formed of, for example, a liquid crystal polymer resin.

As shown in FIGS. 2 to 4, the housing 700 includes a recessed portion 710 and a recessed portion 720 formed so as to recede in directions opposite to each other in the thickness direction 2. The recessed portion 710 and the recessed portion 720 have a rectangular shape when viewed in the thickness direction z. The recessed portion 710 is open upward in the thickness direction z in FIG. 3, and the recessed portion 720 is open downward in the thickness direction z in FIG. 3. The housing 700 includes, inside the recessed portion 710, a light source chamber 711 and a support region 712 in which the support member 300 is placed. The support region 712 includes support surfaces 713, 714 perpendicular to the thickness direction z and an elevated portion 715 protruding in the thickness direction z. In addition, the support region 712 includes a groove 716 formed so as to penetrate in the thickness direction z, at a position overlapping the sensor IC 500 when viewed in the thickness direction z. The upper end of the groove 716 in the thickness direction z communicates with the recessed portion 710, and the lower end communicates with the recessed portion 720.

As shown in FIG. 3, the light source chamber 711 is located on the left side in the recessed portion 710 as illustrated, and the support region 712 is located on the right of the light source chamber 711 as illustrated. The elevated portion 715 is located on the left of the support surface 713 and the support surface 714 in FIG. 3. The support surface 713 is located on the left of the support surface 714 in FIG. 3. The support surface 714 is located at the right end portion of the recessed portion 710 in FIG. 3. The length of the support surface 714 in the secondary scanning direction y is shorter than the length of the support surface 713 in the secondary scanning direction y. The groove 716 is located between the support surface 713 and the support surface 714 in the secondary scanning direction y.

The light source chamber 711 includes a terminal slot 717. As shown in FIGS. 2 and 4, the terminal slot 717 is located at an end portion of the housing 700 in the primary scanning direction x. The terminal slot 717 penetrates through the housing 700 in the thickness direction z, and has a rectangular cross-section.

The substrate 600 is composed of an insulative material such as ceramics or glass epoxy resin, and a non-illustrated wiring pattern formed on the insulative material, and has an elongate rectangular shape extending in the primary scanning direction x. The substrate 600 is accommodated in the recessed portion 720 of the housing 700, and fixed to the housing 700, for example via an adhesive. As shown in FIG. 3, the sensor IC 500 is mounted on the substrate 600.

The transmission plate 800 is a plate-shaped member formed of a transparent material such as glass, and disposed so as to cover the upper face of the recessed portion 710 in the thickness direction z in FIG. 3.

The light source unit 200 serves to emit a linear light beam necessary for the image sensor module 101 to read images, and includes an LED module 210, a light guide 280, and a reflector 285.

Figure 5:
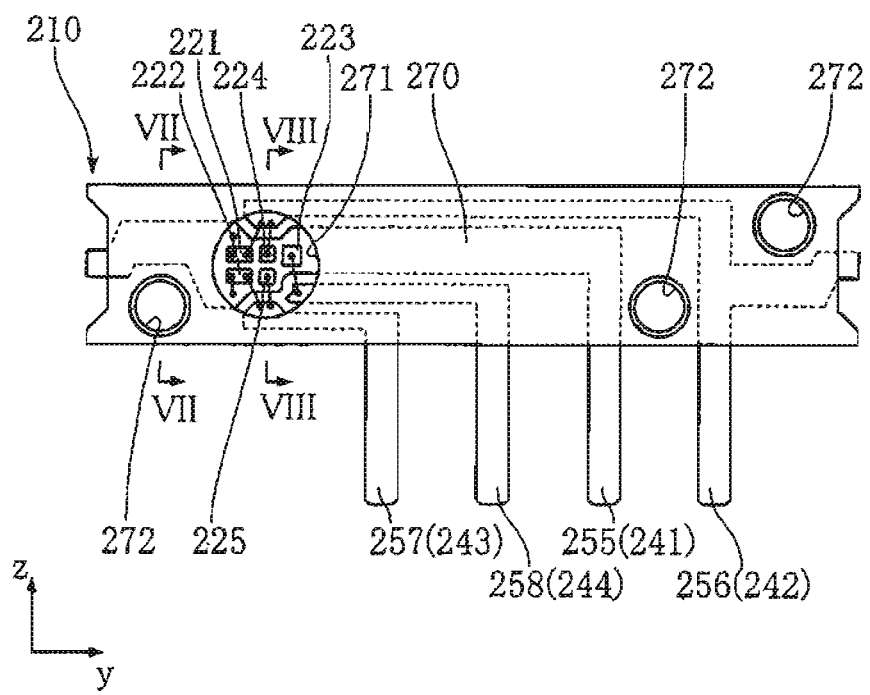
FIG. 5 is a front view showing an LED module of a light source unit employed in the image sensor module shown in FIG. 1.
Figure 6:
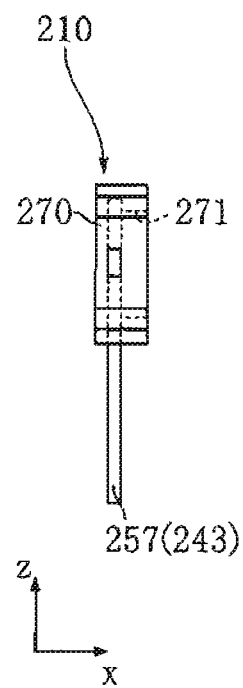
FIG. 6 is a side view of the LED module of the light source unit employed in the image sensor module shown in FIG. 1.

The LED module 210 is the device responsible for the light emitting function of the light source unit 200, and includes LED chips 221, 222, 223, Zener diodes 224, 225, leads 241, 242, 243, 244, and a resin package 270 as shown in FIGS. 5 and 6.

The resin package 270 is formed of a white resin such as a liquid crystal polymer resin or an epoxy resin, and covers a part of each of the leads 241, 242, 243, 244. The resin package 270 includes an opening 271 and a plurality of positioning holes 272. The opening 271 is located close to an end portion of the resin package 270 in the secondary scanning direction y, and has a circular cross-section. The positioning holes 272 are located so as not to interfere with the leads 241, 242, 243, 244, and penetrate through the resin package 270 in this embodiment.

Figure 9:
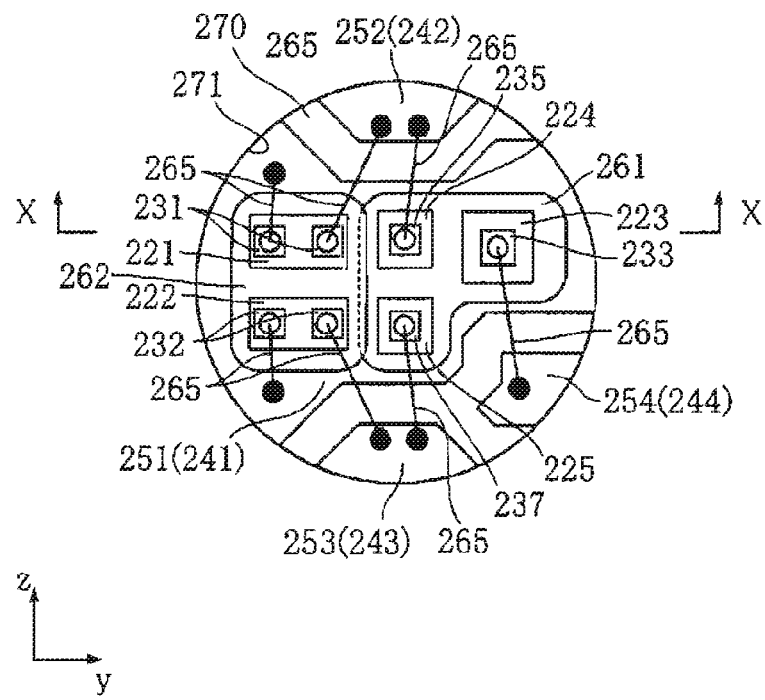
FIG. 9 is an enlarged fragmentary front view showing the opening of the LED module shown in FIG. 5.

As shown in FIGS. 5 and 9, the lead 241 includes a mounting portion 251 and a terminal portion 255. As a whole, the lead 241 includes an elongate portion extending in the secondary scanning direction y and a portion extending in the thickness direction z. The mounting portion 251 is located on the left side in the elongate portion extending in the secondary scanning direction y in FIG. 5, and the LED chips 221, 222, 223 and the Zener diode 224, 225 are mounted on the mounting portion 251. In this embodiment, the mounting portion 251 of the lead 241 has an hourglass shape in which a portion thereof is smaller in the thickness direction z than the remaining portions. The mounting portion 251 is exposed in the opening 271 of the resin package 270. The terminal portion 255 projects downward in the thickness direction z from the resin package 270, and is connected to the substrate 600.

The lead 242 includes a wire bonding portion 252 and a terminal portion 256. As a whole, the lead 242 includes an elongate portion extending in the secondary scanning direction y and a portion extending in the thickness direction z. The wire bonding portion 252 is located close to the left end of the elongate portion extending in the secondary scanning direction y in FIG. 5. In this embodiment, the wire bonding portion 252 projects downward in the thickness direction z toward the mounting portion 251 of the lead 241. The wire bonding portion 252 is exposed in the opening 271 of the resin package 270. The terminal portion 256 projects downward in the thickness direction z from the resin package 270, and is connected to the substrate 600.

The lead 243 includes a wire bonding portion 253 and a terminal portion 257. As a whole, the lead 243 includes a portion extending in the secondary scanning direction y and a portion extending in the thickness direction z. The wire bonding portion 253 is located close to the left end of the portion extending in the secondary scanning direction y in FIG. 5. In this embodiment, the wire bonding portion 253 projects upward in the thickness direction z toward the mounting portion 251 of the lead 241. The wire bonding portion 253 is exposed in the opening 271 of the resin package 270. The terminal portion 257 projects downward in the thickness direction z from the resin package 270, and is connected to the substrate 600.

The lead 244 includes a wire bonding portion 254 and a terminal portion 258. As a whole, the lead 244 includes a portion extending in the secondary scanning direction y and a portion extending in the thickness direction z. The wire bonding portion 254 is located close to the left end of the portion extending in the secondary scanning direction y in FIG. 5. In this embodiment, the wire bonding portion 254 is located in the lower right region in the mounting portion 251 and on the right of the wire bonding portion 253, in FIG. 9. The wire bonding portion 254 is exposed in the opening 271 of the resin package 270. The terminal portion 258 projects downward in the thickness direction z from the resin package 270, and is connected to the substrate 600.

Figure 10:
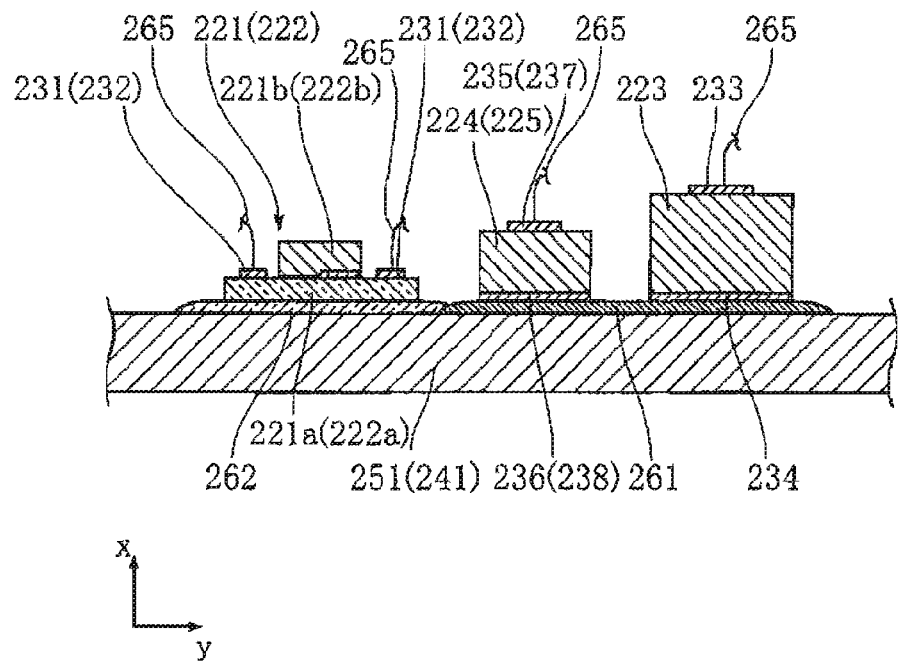
FIG. 10 is a fragmentary cross-sectional view taken along a line X-X in FIG. 9.

The LED chip 221 emits green light in this embodiment. As shown in FIGS. 9 and 10, the LED chip 221 includes a submount substrate 221a, a semiconductor layer 221b, and a pair of surface substrates 231. The submount substrate 221a is, for example, formed of Si. The semiconductor layer 221b is for example formed of a GaN-based semiconductor, and composed of an n-type semiconductor layer, a p-type semiconductor layer, and an active layer (none illustrated) interleaved between the n-type semiconductor layer and the p-type semiconductor layer. The pair of surface substrates 231 is formed on the submount substrate 221a, and electrically connected to the n-type semiconductor layer and the p-type semiconductor layer.

The LED chip 222 emits blue light in this embodiment. Here, reference numerals of constituent of the LED chip 222 corresponding to the respective constituents of the LED chip 221 are indicated in parentheses in FIG. 10, for clearer understanding. The LED chip 222 includes a submount substrate 222a, a semiconductor layer 222b, and a pair of surface substrates 232. The submount substrate 222a is for example formed of Si, and transparent. The semiconductor layer 222b is for example formed of a GaN-based semiconductor, and composed of an n-type semiconductor layer, a p-type semiconductor layer, and an active layer (none illustrated) interleaved between the n-type semiconductor layer and the p-type semiconductor layer. The pair of surface substrates 232 is formed on the submount substrate 222a, and electrically connected to the n-type semiconductor layer and the p-type semiconductor layer.

The LED chip 223 emits red light in this embodiment. As shown in FIGS. 9 and 10, the LED chip 223 includes a semiconductor layer formed of for example a GaAs-based semiconductor material, a surface substrate 233, and a back substrate 234. The semiconductor layer is composed of an n-type semiconductor layer, a p-type semiconductor layer, and an active layer (none illustrated) interleaved between the n-type semiconductor layer and the p-type semiconductor layer. The surface substrate 233 is provided on the upper face of the LED chip 223 in the thickness direction z. The back substrate 234 is provided under the LED chip 223 in the thickness direction z.

The Zener diode 224 serves to prevent the LED chip 221 from being subjected to an excessive voltage. The Zener diode 224 includes a surface substrate 235 and a back substrate 236. The Zener diode 225 serves to prevent the LED chip 222 from being subjected to an excessive voltage. The Zener diode 225 includes a surface substrate 237 and a back substrate 238.

The LED chips 221, 222 are aligned in the thickness direction z, and mounted on the mounting portion 251 of the lead 241 via a dielectric layer 262. In this embodiment the dielectric layer 262 is transparent, and for example formed of a resin. The Zener diodes 224, 225 are aligned in the thickness direction z, and respectively located on the right of the LED chips 221, 222 in the secondary scanning direction y. The LED chip 223 is located on the opposite side of the LED chips 221, 222 in the secondary scanning direction y, across the Zener diodes 224, 225. The LED chip 223 and the Zener diodes 224, 225 are mounted on the mounting portion 251 of the lead 241 via a conductive layer 261. To be more detailed, the back substrate 234 of the LED chip 223 and the back substrates 236, 238 of the Zener diodes 224, 225 are electrically connected to the lead 241 via the conductive layer 261. The conductive layer 261 is, for example, formed of Ag.

The LED chips 221, 222, 223 and the Zener diodes 224, 225 are mounted through the following process. First, a conductive paste to form the conductive layer 261 is applied to the mounting portion 251 of the lead 241. Then the LED chip 223 and the Zener diodes 224, 225 are bonded to the conductive paste. Upon solidifying the conductive paste, for example by sintering, the conductive layer 261 is obtained. Then a resin paste to form the dielectric layer 262 is applied to the mounting portion 251, and the LED chips 221, 222 are bonded on the resin paste. Upon solidifying the resin paste, the dielectric layer 262 is obtained.

Through the mentioned process, the dielectric layer 262 is formed after the conductive layer 261 is formed. Accordingly, in the case where the application region of the conductive paste and the application region of the resin paste overlap each other, the conductive layer 261 is interposed between a part of the dielectric layer 262 and the mounting portion 251 of the lead 241. FIGS. 9 and 10 illustrate the conductive layer 261 and the dielectric layer 262 formed under the mentioned condition. The conductive layer 261 and the dielectric layer 262 may be formed so as not to overlap, depending on the application range of the pastes. However, the dielectric layer 262 is unable to be interposed between the conductive layer 261 and the mounting portion 251 of the lead 241, through the sequence of the mentioned process.

One of the pair of surface substrates 231 of the LED chip 221 is connected to the mounting portion 251 of the lead 241 via a wire 265, and the other is connected to the wire bonding portion 252 of the lead 242 via the wire 265. One of the pair of surface substrates 232 of the LED chip 222 is connected to the mounting portion 251 of the lead 241 via the wire 265, and the other is connected to the wire bonding portion 253 of the lead 243 via the wire 265.

The surface substrate 233 of the LED chip 223 is connected to the wire bonding portion 254 of the lead 244 via the wire 265. The surface substrate 235 of the Zener diode 224 is connected to the wire bonding portion 252 of the lead 242 via the wire 265, and the surface substrate 237 of the Zener diode 225 is connected to the wire bonding portion 253 of the lead 243 via the wire 265.

Figure 8:
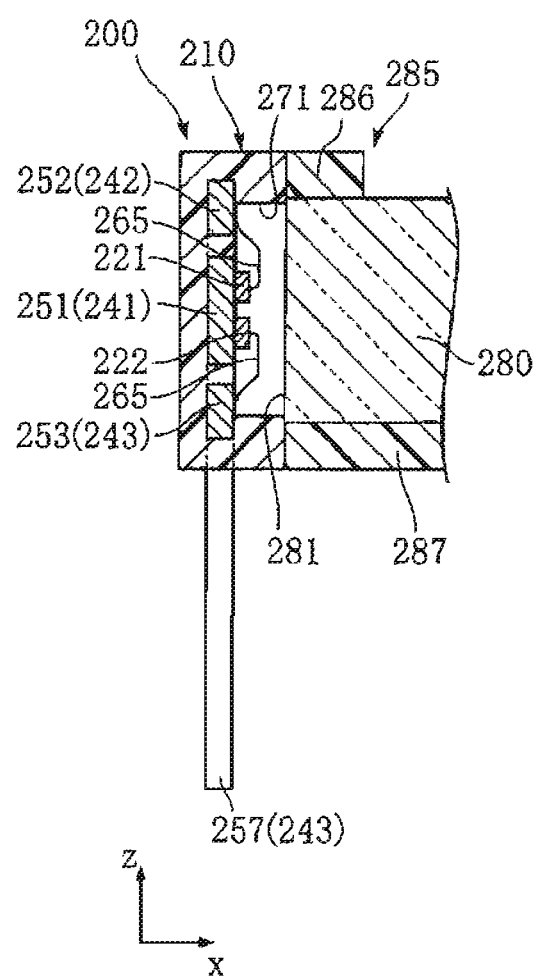
FIG. 8 is a cross-sectional view of the light source unit taken along a line VIII-VIII in FIG. 5.

The light guide 280 serves to convert the light from the LED module 210 into a linear light beam extending in the primary scanning direction x, and for example formed of a transparent acrylic resin such as polymethyl methacrylate (PMMA). The light guide 280 has an elongate column shape extending in the primary scanning direction x and includes, as shown in FIGS. 3 and 8, an incidence surface 281, a reflection surface 282, and an output surface 283.

The incidence surface 281 corresponds to an end face of the light guide 280 in the primary scanning direction x, and disposed so as to close the opening 271 of the resin package 270 of the LED module 210 and to oppose the LED chips 221, 222, 223. The reflection surface 282 is an elongate surface extending in the primary scanning direction x, and located along the lower left portion of the light guide 280 shown in FIG. 3. The reflection surface 282 serves to reflect the light proceeding through inside the light guide 280 after entering through the incidence surface 281. The reflection surface 282 may be a surface on which minute bumps and dips are formed, and a surface on which a white paint is applied. The output surface 283 is an elongate surface extending in the primary scanning direction x, and formed in a shape having an arcuate cross-section in this embodiment. The light reflected by the reflection surface 282 is outputted through the output surface 283 in a form of a linear light beam extending in the primary scanning direction x.

Figure 7:
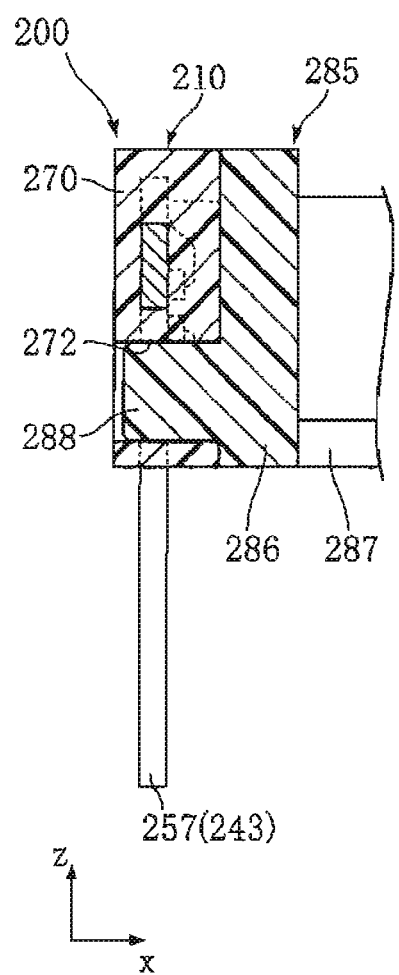
FIG. 7 is a cross-sectional view of the light source unit taken along a line VII-VII in FIG. 5.

The reflector 285 serves to place the light guide 280 in position in the LED module 210 and to prevent accidental leakage of the light from the light guide 280, and is formed of a white resin, for example. The reflector 285 includes a base portion 286 and a semicylindrical portion 287. The base portion 286 has a rectangular shape similar in shape and size to the resin package 270 of the LED module 210, when viewed in the primary scanning direction x. The base portion 286 includes a plurality of projections 288. As shown in FIG. 7, the projections 288 are each fitted in the corresponding positioning hole 272 of the resin package 270 of the LED module 210. Accordingly, the reflector 285 is properly positioned with respect to the LED module 210.

The semicylindrical portion 287 is an elongate portion extending in the primary scanning direction x and, as shown in FIG. 3, supports the light guide 280. A portion of the reflector 285 facing the reflection surface 282 of the light guide 280 serves to return the light outputted from the reflection surface 282 to the light guide 280. By supporting the light guide 280 with the semicylindrical portion 287, the light guide 280 is fixed to the reflector 285. Therefore, the light guide 280 is properly positioned with respect to the LED module 210, together with the reflector 285.

The LED chips 221, 222, 223 and the light guide 280 are retracted to the left in the secondary scanning direction y, with respect to the terminal portions 255, 256, 257, 258. The substrate 600 has a size in the secondary scanning direction y just enough for connection with the terminal portions 255, 256, 257, 258, and an abundant vacant space is unavailable. Therefore, the LED chip 221, 222, 223 and the light guide 280 are retracted to the left from the substrate 600 in the secondary scanning direction y. In this embodiment, the light guide 280 and the substrate 600 are located so as not to overlap at all in the secondary scanning direction y. However, in the present invention, the light guide 280 and the substrate 600 may partially overlap in the secondary scanning direction y.

Figure 11:
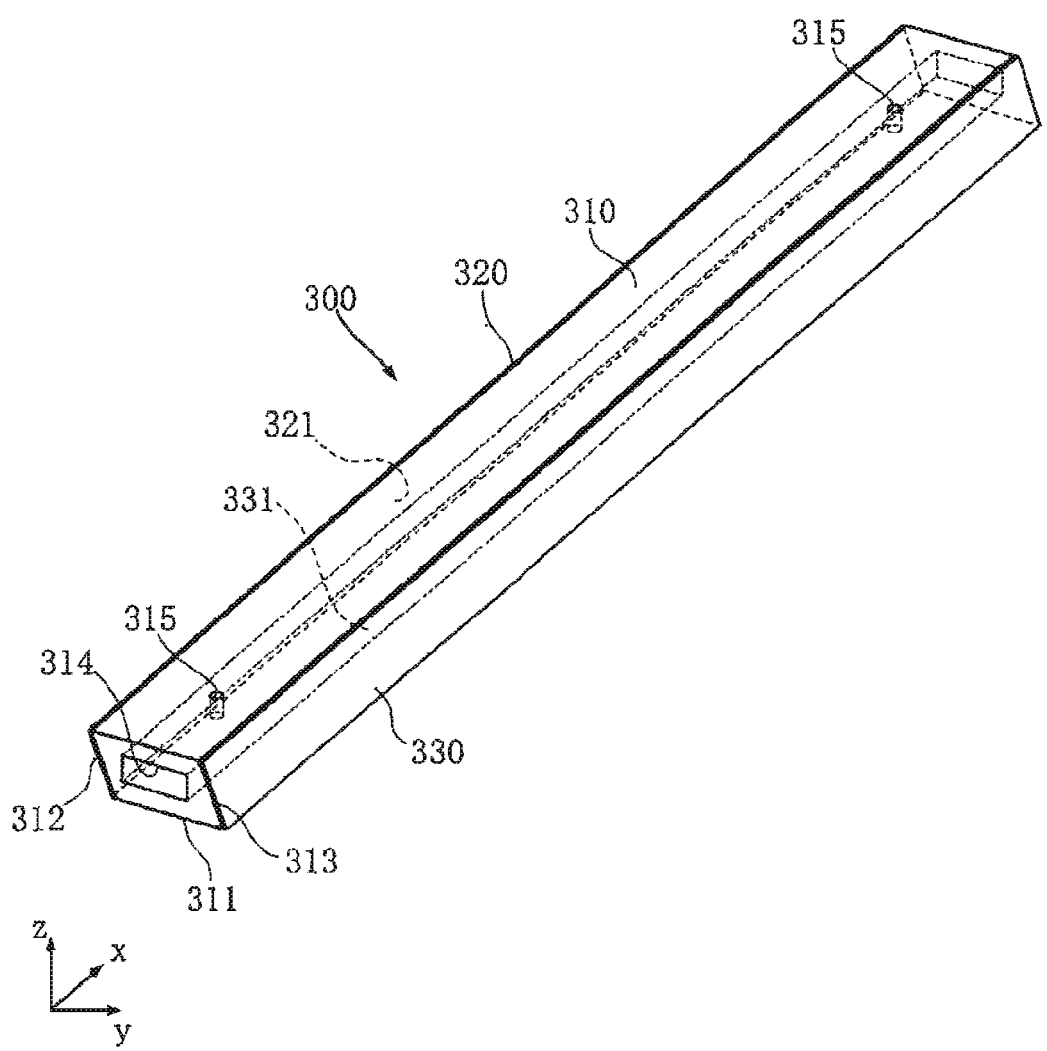
FIG. 11 is a perspective view showing a support member employed in the image sensor module shown in FIG. 1.

The support member 300 includes, as shown in FIG. 11, an elongate bar-shaped transmissive portion 310 extending in the primary scanning direction x, and non-transmissive layers 320, 330 located on the respective side faces of the transmissive portion 310 in the secondary scanning direction y. The transmissive portion 310 is formed of a transparent acrylic resin, and includes a bottom face 311 perpendicular to the thickness direction z, a sloped surface 312 connected to the left edge of the bottom face 311 in the secondary scanning direction y in FIG. 11, and another sloped surface 313 connected to the right edge of the bottom face 311 in the secondary scanning direction y in FIG. 11. The sloped surface 312 is inclined, as shown in FIG. 3, so as to be closer to the light guide 280 of the light source unit 200 in the secondary scanning direction y, as proceeding away from the bottom face 311 in the thickness direction z. The angle between the sloped surface 312 and the bottom face 311 is, for example, 45 degrees. The sloped surface 313 is inclined, as shown in FIG. 3, so as to be closer to the light guide 280 of the light source unit 200 in the secondary scanning direction y, as proceeding away from the bottom face 311 in the thickness direction z. The angle between the sloped surface 313 and the bottom face 311 is, for example, 45 degrees. Further, the transmissive portion 310 includes a cavity 314 of an elongate shape extending in the primary scanning direction x. The cavity 314 has a rectangular shape when viewed in the direction x. In this embodiment, the cavity 314 penetrates through the transmissive portion 310 in the primary scanning direction x. Here, the cavity 314 may be formed with an opening only on either side in the primary scanning direction x. The lens unit 400 is accommodated in the cavity 314. In addition, the transmissive portion 310 includes a plurality of holes 315 extending in the thickness direction z so as to reach the cavity 314.

The non-transmissive layer 320 is formed of aluminum for example, so as to cover the sloped surface 312. The non-transmissive layer 330 is also formed of aluminum, so as to cover the sloped surface 313.

The support member 300 includes a reflection surface 321 provided along the interface between the sloped surface 312 and the non-transmissive layer 320, and a reflection surface 331 provided along the interface between the sloped surface 313 and the non-transmissive layer 330. More specifically, the reflection surface 321 is the surface of the non-transmissive layer 320 disposed in contact with the sloped surface 312, and the reflection surface 331 is the surface of the non-transmissive layer 330 disposed in contact with the sloped surface 313. The surface of the non-transmissive layer 320 opposite to the reflection surface 321 abuts against the upper end portion of the elevated portion 715 in the thickness direction z in FIG. 3. The lower end portion of the surface of the non-transmissive layer 330 in the thickness direction 2 opposite to the reflection surface 331 abuts against the right sidewall of the recessed portion 710 in FIG. 3. With such a configuration, the position of the support member 300 in the secondary scanning direction y is fixed.

Figure 12:
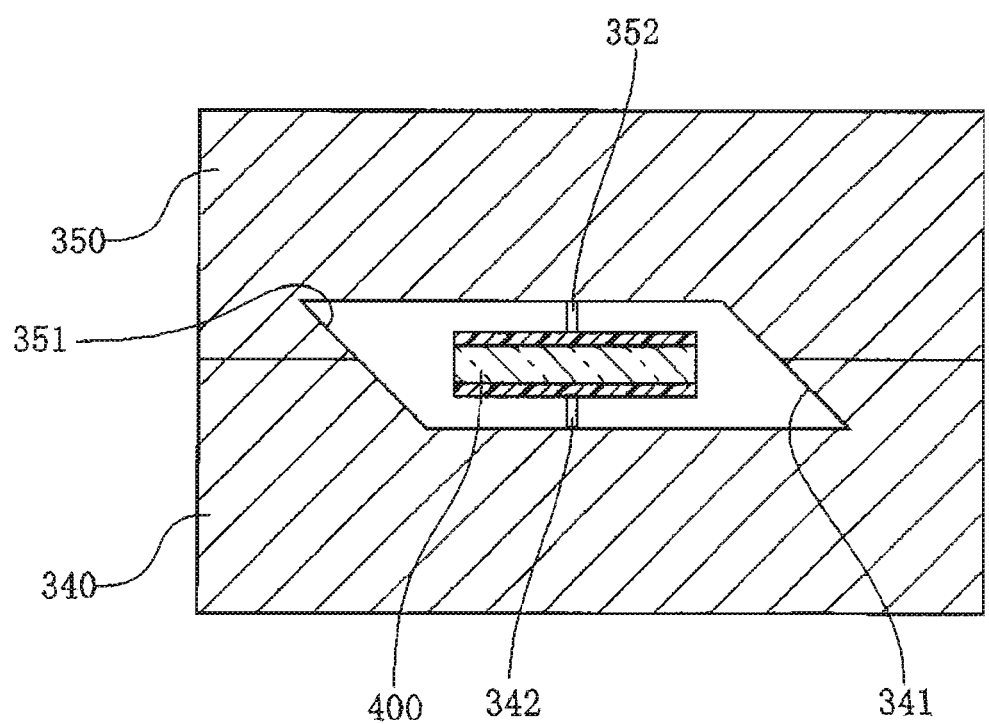
FIG. 12 is a cross-sectional view showing an example of the manufacturing process of the support member shown in FIG. 11.

FIG. 12 illustrates an example of the manufacturing process of the support member 300. To manufacture the transmissive portion 310 that serves as the base for the support member 300, a pair of molds 340, 350 facing each other is employed, as shown in FIG. 12. The mold 340 includes a cavity 341, and the mold 350 includes a cavity 351. The sidewalls of the cavity 341 and cavity 351 are each inclined by 45 degrees with respect to the bottom face, such that upon combining the cavity 341 and the cavity 351, the outer shape of the transmissive portion 310 is defined. The transmissive portion 310 can be formed upon introducing an acrylic resin of a liquid phase in the cavity 341 and the cavity 351 with the lens unit 400 fixed therebetween, and solidifying the acrylic resin. To support the lens unit 400, a support pin 342 is provided in the cavity 341, and a support pin 352 is provided in the cavity 351. At the positions corresponding to the support pins 342, 352, the holes 315 are formed.

The cavity 314 is formed because the lens unit 400 is held between the mold 340 and the mold 350. Such a manufacturing process is feasible because the lens unit 400 and the transmissive portion 310 are both formed of a resin and hence barely different in thermal expansion coefficient. The support member 300 accommodating therein the lens unit 400 can be efficiently manufactured through the mentioned manufacturing process. In addition, the mentioned manufacturing process allows the cavity 314 to be formed with an opening on neither of the end portions in the primary scanning direction x.

The non-transmissive layers 320, 330 can be formed by depositing aluminum, for example through a sputtering process, on the sloped surface 312 and the sloped surface 313 of the transmissive portion 310, respectively.

The lens unit 400 is formed in an elongate shape extending in the primary scanning direction x, and includes an incidence surface 401 and an output surface 402 oriented in opposite directions in the secondary scanning direction y. As shown in FIG. 3, the incidence surface 401 is located at a position more distant from the sensor IC 500 than the output surface 402, in the secondary scanning direction y. The lens unit 400 includes a plurality of rod lenses and a housing, for example formed of a resin, enclosing the rod lenses. The rod lenses are configured to form an upright image of the content of the object to be read 890 in equal magnification in the sensor IC 500, and has an optical axis aligned with the secondary scanning direction y and perpendicular to the primary scanning direction x.

As shown in FIG. 3, the lens unit 400 is fitted in the cavity 314 of the support member 300 such that the optical axis is aligned with the secondary scanning direction y. The incidence surface 401 and the output surface 402 are located so as to overlap the reflection surfaces 321, 331, respectively, when viewed in the secondary scanning direction y. Light incident on the reflection surface 321 along the thickness direction 2 is reflected by the reflection surface 321 and proceeds toward the incidence surface 401 in the secondary scanning direction y. The light introduced through the incidence surface 401 passes through the rod lenses in the lens unit 400 and is outputted through the output surface 402 in the secondary scanning direction y. The light outputted through the output surface 402 is reflected by the reflection surface 331 so as to proceed in the thickness direction z, and then reaches the sensor IC 500 through the groove 716.

The sensor IC 500 has a photoelectric conversion function to convert received light into an electrical signal, and is mounted on the substrate 600. The sensor IC 500 includes a plurality of photodetecting surfaces (not shown) aligned in the primary scanning direction x. The lens unit 400 forms an image on the photodetecting surface based on the light reflected by the object to be read 890.

The transmission plate 800 includes a light shielding layer 810. The light shielding layer 810 may be formed by applying a black paint to a part of the lower face of the transmission plate 800, or adhering thereto a black resin tape. The light shielding layer 810 has an elongate shape extending in the primary scanning direction x, and overlaps a portion of the lens unit 400 in the vicinity of the right end portion thereof, in the secondary scanning direction y.

Advantageous effects of the image sensor module 101 will now be described hereunder.

In this embodiment, as shown in FIG. 3, the optical path arranged from the object to be read 890 to the sensor IC 500 is bent, and the section passing through the lens unit 400 is parallel to the secondary scanning direction y. Accordingly, prolonging the optical path does not incur an increase in size of the image sensor module 101 in the thickness direction z. The reflection surfaces 321, 331 that serve to bend the optical path are provided in the support member 300. The support member 300 is supported by the transmissive portion 310 formed of an acrylic resin, and hence can participate in securing a part of the rigidity of the housing 700. In this embodiment, the support member 300 abuts against the right sidewall of the recessed portion 710 in FIG. 3 and the elevated portion 715, and thus prevents the housing 700 from being distorted. Therefore, the image sensor module 101 can be made thinner in the thickness direction z, without compromising the rigidity of the housing 700.

In this embodiment, the sloped surfaces 312, 313 of the transmissive portion 310 are formed by the shape of the molds 340, 350. Such a manufacturing process suppresses fluctuation of the shape of the sloped surfaces 312, 313, compared with the case of, for example, cutting an acrylic plate having an elongate rectangular cross section to form the sloped surfaces 312, 313.

Forming the substrate 600 in a width that keeps the substrate 600 from overlapping the light guide 280 and the LED chips 221, 222, 223 in the secondary scanning direction y contributes to minimizing unnecessary space on the substrate 600, which leads to reduction in manufacturing cost.

FIGS. 13 through 37 illustrate other embodiments of the present invention. In these drawings, constituents that are the same as or similar to those cited in the embodiment are given the same numeral as above.

Figure 13:
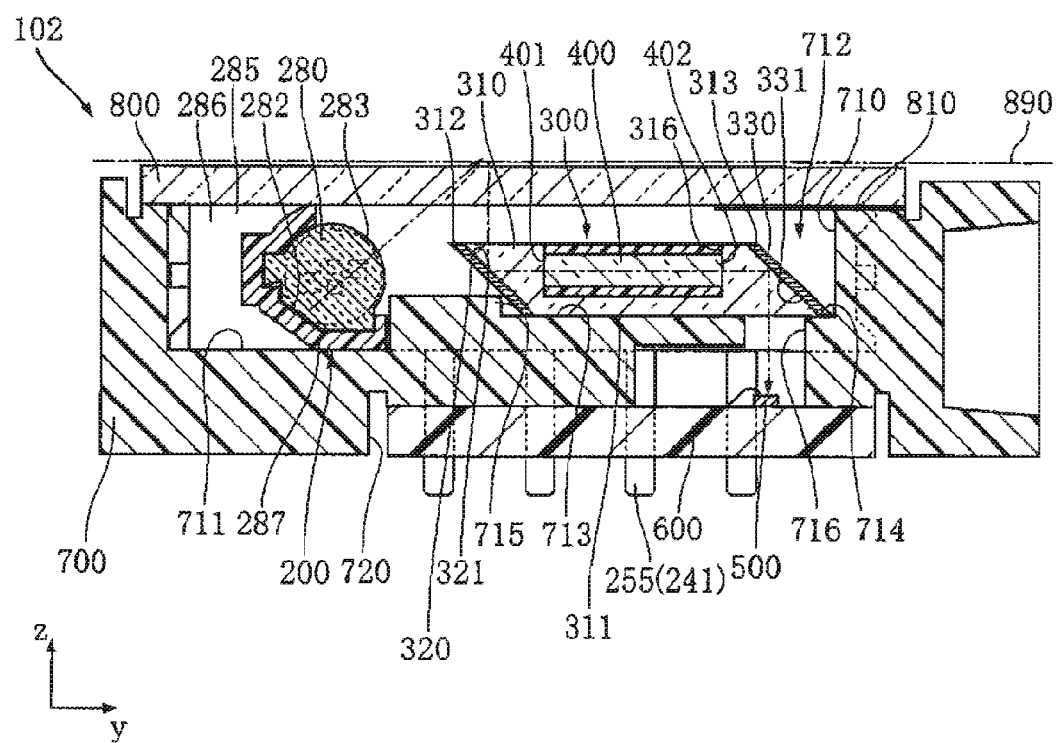
FIG. 13 is a cross-sectional view showing an image sensor module according to a second embodiment of the present invention.
Figure 14:
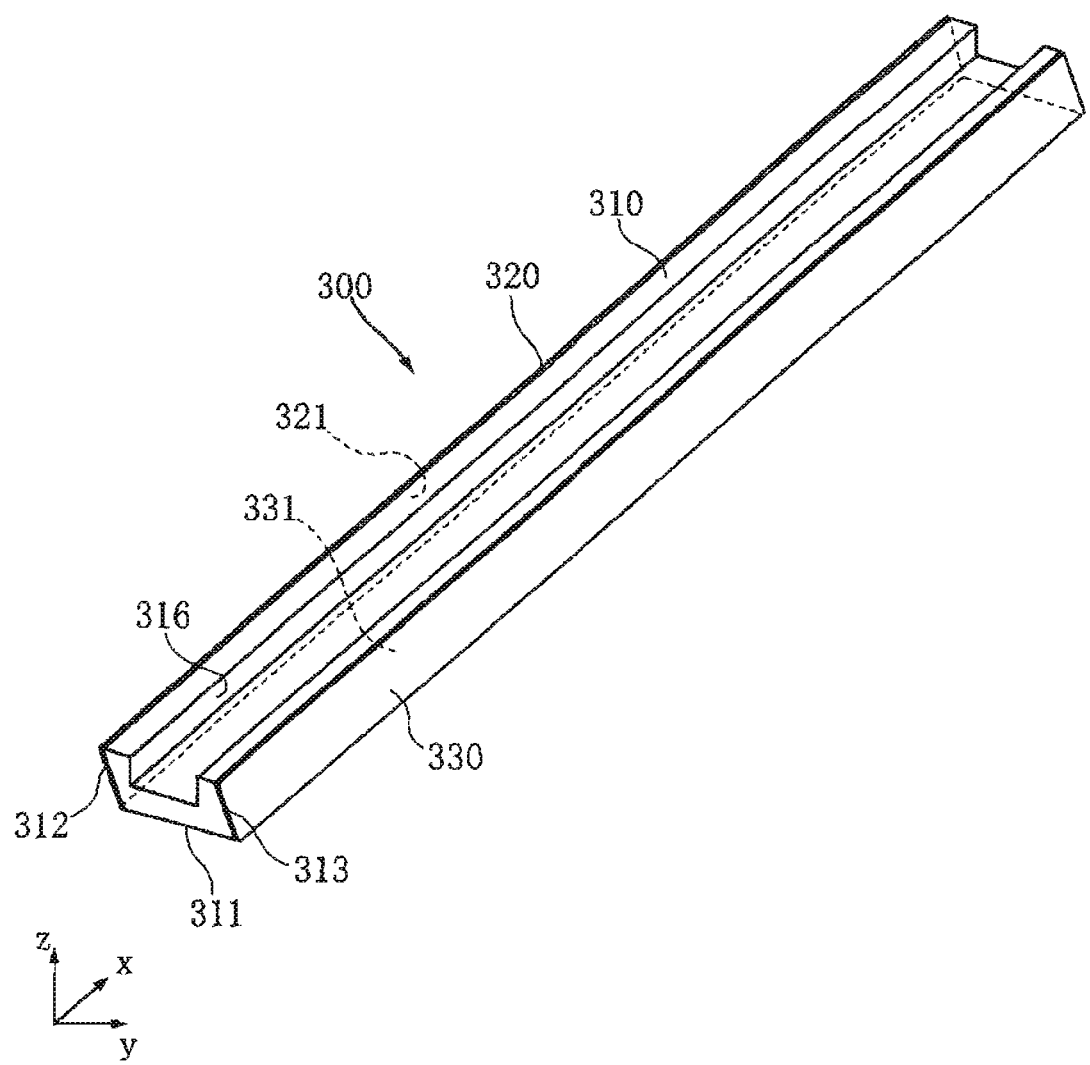
FIG. 14 is a perspective view showing a support member employed in the image sensor module shown in FIG. 13.

FIGS. 13 and 14 illustrate an image sensor module according to a second embodiment of the present invention. The image sensor module 102 according to this embodiment is different from the image sensor module 101 in the shape of the support member 300, and the remaining portions are configured in the same way as the image sensor module 101.

Figure 15:
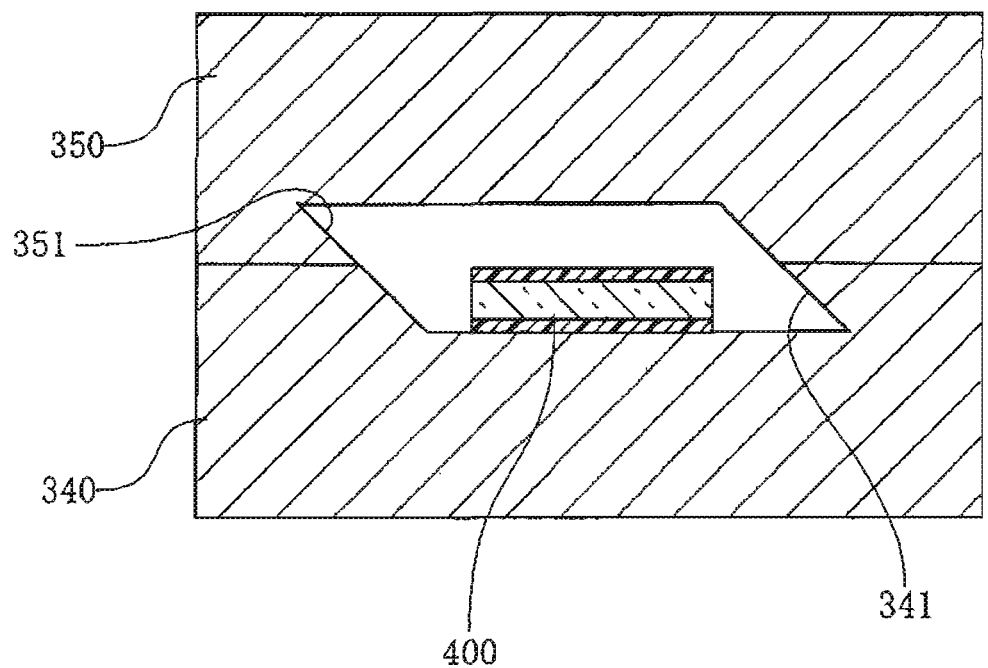
FIG. 15 is a cross-sectional view showing an example of the manufacturing process of the support member shown in FIG. 13.

As shown in FIGS. 13 and 14, the transmissive portion 310 of the support member 300 in this embodiment includes a recessed portion 316, in place of the cavity 314. The recessed portion 316 is formed so as to recede toward the bottom face 311 in the thickness direction z, from the surface of the transmissive portion 310 opposite to the bottom face 311. The recessed portion 316 thus configured can be formed, as shown in FIG. 15, for example by placing the lens unit 400 on the bottom face of the cavity 341 of the mold 340. Such a manufacturing method eliminates the need to use the support pins 342, 352.

Figure 16:
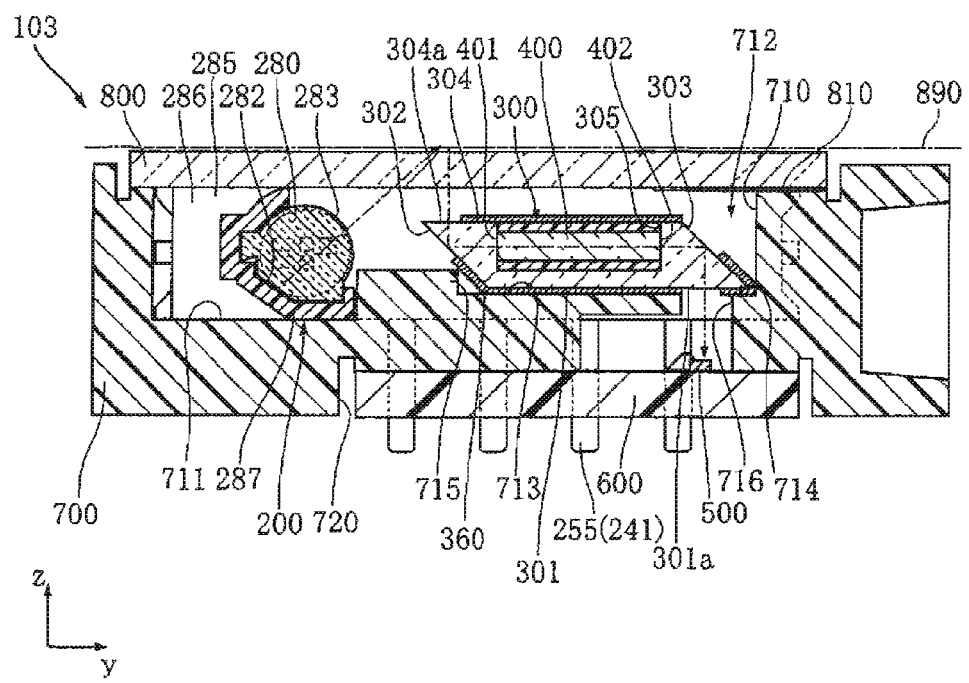
FIG. 16 is a cross-sectional view showing an image sensor module according to a third embodiment of the present invention.
Figure 17:
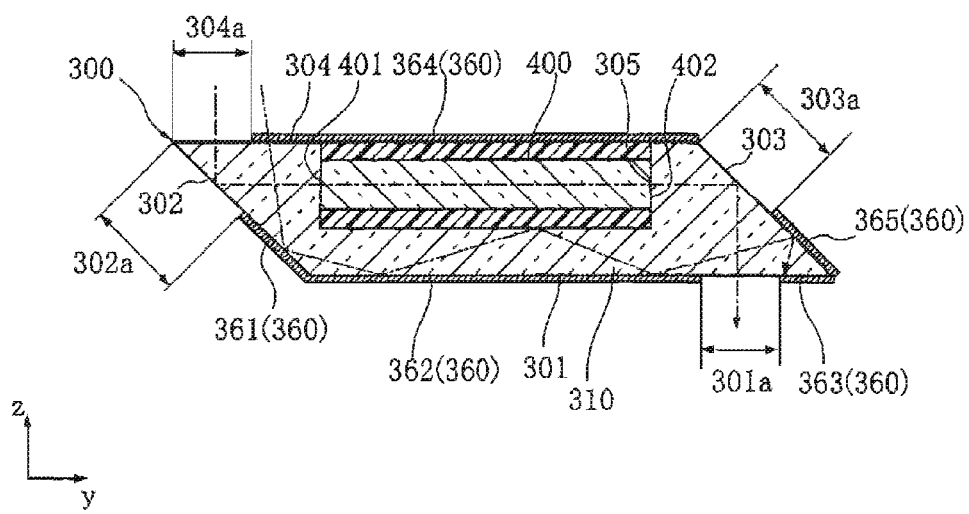
FIG. 17 is an enlarged cross-sectional view showing a support member and a lens unit shown in FIG. 16.

FIGS. 16 and 17 illustrate an image sensor module according to a third embodiment of the present invention. The image sensor module 103 shown in FIGS. 16 and 17 is different from the image sensor module 102 in the configuration of the support member 300, and further includes a light shielding member 360. The remaining portions of the image sensor module 103 are configured in the same way as those of the image sensor module 102. FIG. 17 is an enlarged cross-sectional view of the support member 300, the lens unit 400, and the light shielding member 360 extracted from FIG. 16.

The support member 300 according to this embodiment is formed of a transparent acrylic resin, in generally the same shape as the transmissive portion 310 shown in FIG. 14. The support member 300 according to this embodiment includes a bottom face 301 supported by the housing 700, a sloped surface 302 and a sloped surface 303 inclined with respect to the bottom face 301, and a top face 304 located opposite to the bottom face 301 in the thickness direction z. In addition, the support member 300 includes a recessed portion 305 formed so as to recede in the thickness direction z. The recessed portion 305 is formed so as to recede from the top face 304 toward the bottom face 301. The lens unit 400 is fitted in the recessed portion 305.

As shown in FIGS. 16 and 17, the sloped surface 302 is located at the left end of the support member 300 and the sloped surface 303 is located at the right end of the support member 300, as illustrated. The sloped surface 302 and the sloped surface 303 are inclined so as to be closer to the light guide 280 of the light source unit 200 in the secondary scanning direction y, as proceeding away from the bottom face 301 in the thickness direction 2. The angle defined between the sloped surface 302 and the bottom face 301, and the angle defined between the sloped surface 303 and the bottom face 301 are, for example, 45 degrees. The sloped surface 302 and the sloped surface 303 are mirror-finished, and totally reflect the light proceeding through inside the support member 300 at the interface with air, to the inside of the support member 300. In this embodiment, a part of the sloped surface 302 constitutes a reflection surface 302a, and a part of the sloped surface 303 constitutes a reflection surface 303a. The reflection surface 302a reflects the light from the object to be read 890 toward the incidence surface 401. The reflection surface 303a reflects the light from the output surface 402 toward the sensor IC 500.

Here, the sloped surface 302 and the sloped surface 303 of the support member 300 formed of an acrylic resin possess a certain level of reflectance even without the mirror finish. Accordingly, it is not mandatory to apply the mirror finish to the sloped surface 302 and the sloped surface 303.

In this embodiment also, the optical path arranged from the object to be read 890 to the sensor IC 500 is bent, and the section passing through the lens unit 400 is parallel to the secondary scanning direction y. Accordingly, prolonging the optical path does not incur an increase in size of the image sensor module 103 in the thickness direction z. Further, the support member 300 is formed of an acrylic resin and hence can participate in securing a part of the rigidity of the housing 700. In this embodiment also, the support member 300 abuts against the right sidewall of the recessed portion 710 in FIG. 16 and the elevated portion 715, and thus prevents the housing 700 from being distorted. Therefore, the image sensor module 103 can be made thinner in the thickness direction z, without compromising the rigidity of the housing 700.

The light shielding member 360 covers the support member 300 so as to expose at least the reflection surface 302a and the reflection surface 303a. The light shielding member 360 may be an adhesive tape made of a black resin and adhered to the support member 300. As shown in FIG. 17, the light shielding member 360 includes a sloped surface anti-reflection portion 361, a bottom face anti-reflection portion 362, a bottom face cover portion 363, a top face cover portion 364, and a sloped surface anti-reflection portion 365. Here, the light shielding member 360 that provides the same effect can also be obtained by printing a black resin on the surface of the support member 300.

Further, the light shielding member 360 may be formed by spraying a paint or through a sputtering process.

As shown in FIG. 17, the sloped surface anti-reflection portion 361 is in close contact with a portion of the sloped surface 302. The portion of the sloped surface 302 in close contact with the sloped surface anti-reflection portion 361 is unable to serve as a reflection surface. On the contrary, the portion of the sloped surface 302 uncovered with the sloped surface anti-reflection portion 361 constitutes an interface with air, and hence constitutes the reflection surface 302a.

The bottom face anti-reflection portion 362 and the bottom face cover portion 363 cover the bottom face 301 so as to expose a portion thereof. The portion of the bottom face 301 uncovered with the bottom face anti-reflection portion 362 and the bottom face cover portion 363 constitutes an output portion 301a through which the light from the reflection surface 303a is outputted toward the sensor IC 500. As shown in FIG. 16, the output portion 301a is disposed so as to oppose the groove 716.

The bottom face anti-reflection portion 362 is in close contact with a portion of the bottom face 301 from the left end in FIG. 17 to the left edge of the output portion 301a. In this embodiment, the bottom face anti-reflection portion 362 is formed integrally with the sloped surface anti-reflection portion 361.

The bottom face cover portion 363 covers a portion of the bottom face 301 from the right end in FIG. 17 to the right edge of the output portion 301a.

Here, the bottom face anti-reflection portion 362 may be formed, for example, by employing a black adhesive when the support member 300 is placed on the support surface 713, instead of adhering a black tape or printing a black resin. The black adhesive can be obtained, for example, by adding a dye to an adhesive composed of an epoxy resin. Likewise, the bottom face cover portion 363 may also be formed by bonding the support member 300 and the support surface 714 together with a black adhesive.

The top face cover portion 364 covers the majority of the top face 304. A portion of the top face 304 uncovered with the top face cover portion 364 constitutes an entrance portion 304a through which the light from the object to be read 890 is introduced. The entrance portion 304a is located at the left end of the support member 300 in FIG. 17, and overlaps the reflection surface 302a when viewed in the thickness direction z.

In the example shown in FIG. 17, the top face cover portion 364 also covers the lens unit 400. Such a configuration is obtained by forming the light shielding member 360 after the lens unit 400 is placed in the support member 300. However, the light shielding member 360 may be formed before placing the lens unit 400 in the support member 300. In this case, the lens unit 400 is exposed through the light shielding member 360.

The sloped surface anti-reflection portion 365 is in close contact with a portion of the sloped surface 303. The portion of the sloped surface 303 in close contact with the sloped surface anti-reflection portion 365 is unable to serve as a reflection surface. On the contrary, the portion of the sloped surface 303 uncovered with the sloped surface anti-reflection portion 365 constitutes an interface with air, and hence constitutes the reflection surface 303a. The sloped surface anti-reflection portion 365 corresponds to the additional sloped surface anti-reflection portion in the present invention.

In the case where the light shielding member 360 is not provided, the light that has entered through the top face 304 may be reflected by the bottom face 301, the sloped surface 302, and the sloped surface 303 so as to reach the sensor IC 500 as stray light without passing through the lens unit 400, for example as indicated by dash-dot-dot lines in FIG. 17. In the case where the object to be read 890 contains for example a black pattern, such stray light may disable the image sensor module from recognizing the black pattern. The light shielding member 360 serves to prevent such a malfunction.

The sloped surface anti-reflection portion 361, the bottom face anti-reflection portion 362, and the sloped surface anti-reflection portion 365 serve to suppress reflection to inside of the support member 300, thereby preventing the stray light from proceeding inside the support member 300. The bottom face cover portion 363 prevents the stray light from being outputted from the support member 300. The top face cover portion 364 prevents intrusion of unnecessary light into the support member 300.

The function of the bottom face cover portion 363 may instead be realized by adjusting the shape of a portion of the housing 700 in the vicinity of the groove 716. For example, the groove 716 may be made narrower, so that the region to be covered with the bottom face cover portion 363 is covered with the support surface 714.

Further, the top face cover portion 364 may be substituted with the light shielding layer 810. Alternatively, an eave member may be provided on the housing 700 so as to block the light from an upper position in FIG. 16.

To prevent intrusion of unnecessary light into the support member 300, cover layers that respectively cover the sloped surface 302 and the sloped surface 303 may be provided. Such cover layers may be formed of a black resin like the light shielding member 360. Here, it is preferable that the cover portions are slightly spaced from the sloped surface 302 and the sloped surface 303, so as not to affect the performance of the reflection surface 302a and the reflection surface 303a.

The provision of the light shielding member 360 on the light-transmissive support member 300 may be applied to similar fields, without limitation to the image sensor module. In an LED printing head for example, normal printing performance is disturbed when stray light emerges in a light guide that guides the light from the LED. Adhering a black adhesive tape or printing a black resin on the light guide is useful for preventing such a situation.

Figure 18:
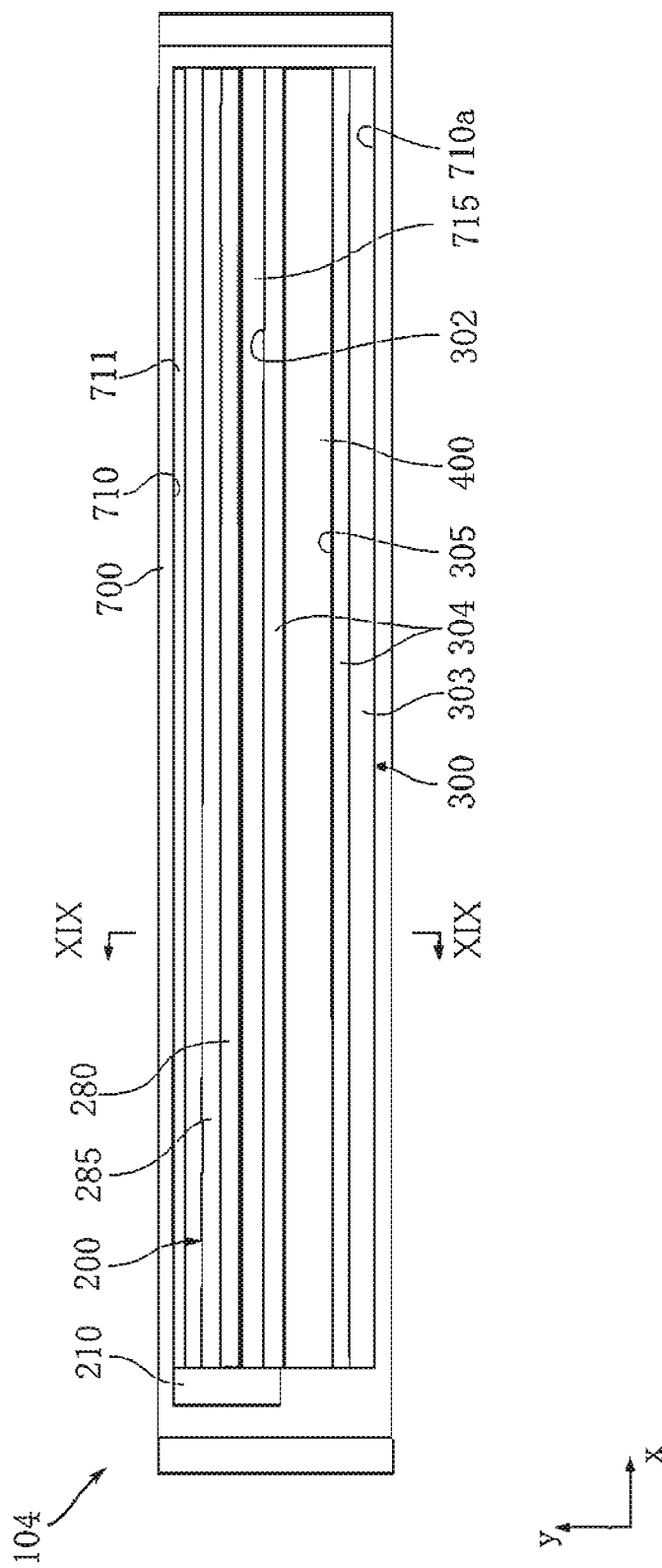
FIG. 18 is a plan view showing an image sensor module according to a fourth embodiment of the present invention.
Figure 19:
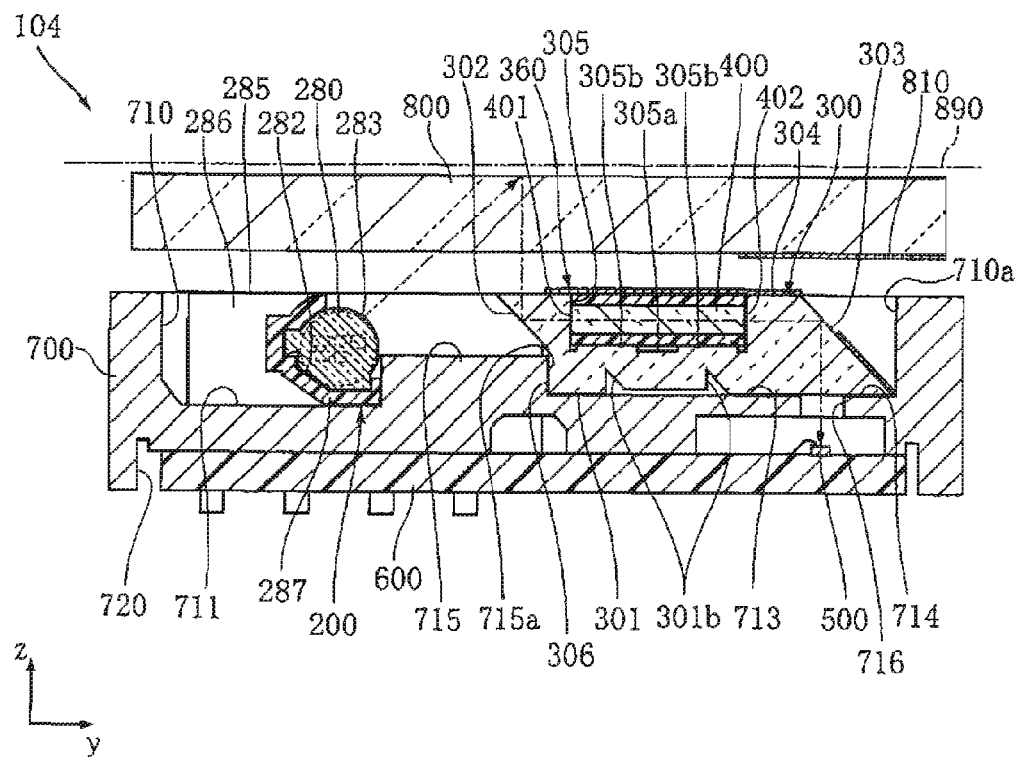
FIG. 19 is a cross-sectional view taken along a line XIX-XIX in FIG. 18.
Figure 20:
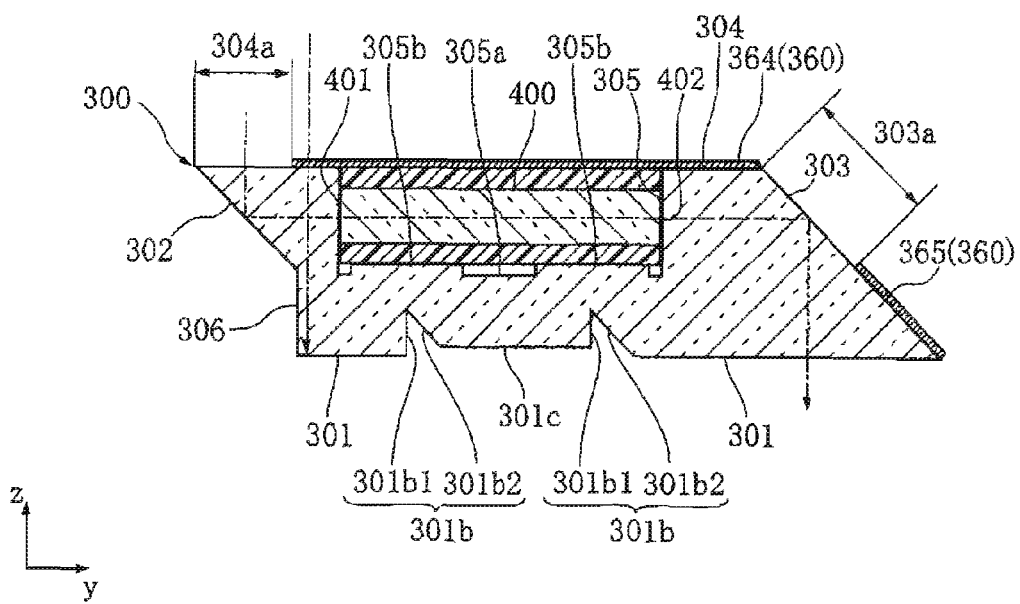
FIG. 20 is an enlarged cross-sectional view showing a support member and a lens unit shown in FIG. 19.

FIGS. 18 and 19 illustrate an image sensor module according to a fourth embodiment of the present invention. The image sensor module 104 shown in FIGS. 18 and 19 may be incorporated, for example, in a document scanner designed to optically read characters and images printed on the object to be read 890 to thereby generate electronic data containing those characters and images, as is the image sensor module 101. Although the transmission plate 800 is fixed to the housing 700 in the image sensor module 101 shown in FIG. 1, in the image sensor module 104 according to this embodiment the housing 700 and the transmission plate 800 are separated from each other. The transmission plate 800 according to this embodiment is fixed, for example, to the casing of a document scanner in which the image sensor module 104 is incorporated. Except for such a difference in configuration, the basic structure of the image sensor module 104 is similar to that of the image sensor module 101. FIG. 20 is an enlarged cross-sectional view of the support member 300 and the lens unit 400 shown in FIG. 19. Referring to FIGS. 18 to 20, the difference between the image sensor module 104 and the image sensor module 101 will be described hereunder.

The support member 300 according to this embodiment is formed of a transparent acrylic resin, in a shape similar to the transmissive portion 310 shown in FIG. 14. The support member 300 according to this embodiment includes a bottom face 301 disposed in contact with the housing 700, the sloped surface 302, the sloped surface 303, the top face 304 opposite to the bottom face 301 in the thickness direction z, and an upright surface 306 erected with respect to the bottom face 301 and extending in the primary scanning direction x. In addition, the support member 300 includes the recessed portion 305 formed so as to recede in the thickness direction z. The recessed portion 305 is formed so as to recede from the top face 304 toward the bottom face 301. The lens unit 400 is fitted in the recessed portion 305.

As shown in FIG. 20, the image sensor module 104 according to this embodiment includes the light shielding member 360 that covers a part of the support member 300. The light shielding member 360 according to this embodiment includes the top face cover portion 364 and the sloped surface anti-reflection portion 365. Here, the top face cover portion 364 and the sloped surface anti-reflection portion 365 according to this embodiment are the same as the top face cover portion 364 and the sloped surface anti-reflection portion 365 in the image sensor module 103. The portion of the top face 304 uncovered with the top face cover portion 364 constitutes the entrance portion 304a through which the light from the object to be read 890 is introduced.

The sloped surface 302 according to this embodiment is shorter than the sloped surface of, for example, the support member 300 in the image sensor module 103, because the upright surface 306 is provided. Therefore, unlike in the image sensor module 103, the sloped surface anti-reflection portion 361 is less important. However, in the case where the lens unit 400 is smaller and hence the sloped surface 302 has to be made narrower, it is advantageous to provide the sloped surface anti-reflection portion 361.

As shown in FIG. 20, the bottom face 301 according to this embodiment includes a pair of grooves 301b recessed upward in the thickness direction z as illustrated. The grooves 301b both extend in the primary scanning direction x, and are spaced from each other in the scanning direction y. The grooves 301b each include a groove upright surface 301b1 perpendicularly erected with respect to the bottom face 301, and a groove sloped surface 301b2 inclined with respect to the groove upright surface 301b1 and the bottom face 301. In each of the grooves 301b, the groove upright surface 301b1 is located on the left of the groove sloped surface 301b2 in the secondary scanning direction y in FIG. 20.

Further, the bottom face 301 includes a belt-like region 301c located between the pair of grooves 301b in the secondary scanning direction y. In this embodiment, the belt-like region 301c is slightly recessed upward with respect to the remaining region of the bottom face 301, in the thickness direction 2 in FIG. 20. Accordingly, a gap is defined between the support surface 713 and the belt-like region 301c. A non-illustrated adhesive for bonding the bottom face 301 and the support surface 713 is to be introduced in the gap. The adhesive introduced in the gap further intrudes in the pair of grooves 301b.

As shown in FIG. 19, the sloped surface 302 is located at the left end of the support member 300, and the sloped surface 303 is located at the right end of the support member 300, as illustrated. The sloped surface 302 and the sloped surface 303 are inclined so as to be closer to the light guide 280 of the light source unit 200 in the secondary scanning direction y, as proceeding away from the bottom face 301 in the thickness direction z. The angle defined between the sloped surface 302 and the bottom face 301, and the angle defined between the sloped surface 303 and the bottom face 301 are, for example, 45 degrees. The sloped surface 302 and the sloped surface 303 are mirror-finished, and totally reflect the light proceeding through inside the support member 300 at the interface with air, to the inside of the support member 300. The sloped surface 302 according to this embodiment corresponds to the reflection surface in the present invention, and reflects the light from the object to be read 890 toward the incidence surface 401. The portion of the sloped surface 303 according to this embodiment uncovered with the sloped surface anti-reflection portion 365 constitutes the reflection surface 303a that reflects the light from the output surface 402 toward the sensor IC 500. The reflection surface 303a corresponding to the additional reflection surface in the present invention.

As shown in FIG. 20, the recessed portion 305 according to this embodiment includes a bottom groove 305a, and bottom elevated portions 305b protruding upward with respect to the bottom groove 305a in the thickness direction z as illustrated. The respective top faces of the bottom elevated portions 305b serve to support the lens unit 400.

As shown in FIG. 20, the upright surface 306 is located at the left end of the support member 300 as illustrated, and perpendicularly erected with respect to the bottom face 301. The sloped surface 302 and the sloped surface 303 are inclined by 45 degrees with respect to the upright surface 306. In this embodiment, the upright surface 306 is formed so as to connect between the lower edge of the sloped surface 302 in FIG. 20 and the left edge of the bottom face 301 in FIG. 20. The upright surface 306 is located at a lower position from the lens unit 400 in the thickness direction z in FIG. 20.

As shown in FIG. 19, the upright surface 306 is in contact with the elevated portion 715 of the housing 700. To be more detailed, the elevated portion 715 has a side face 715a erected with respect to the support surface 713, and the upright surface 306 abuts against such side face 715a.

The transmission plate 800 according to this embodiment also includes the light shielding layer 810. The light shielding layer 810 may be formed by applying a black paint to a part of the lower face of the transmission plate 800, or adhering thereto a black resin tape. The light shielding layer 810 has an elongate shape extending in the primary scanning direction x, and overlaps a portion of the lens unit 400 in the vicinity of the right end portion thereof, in the secondary scanning direction y. The light shielding layer 810 serves to prevent intrusion of unnecessary light into the support member 300 from the sloped surface 303.

In this embodiment also, the optical path arranged from the object to be read 890 to the sensor IC 500 is bent, and the section passing through the lens unit 400 is parallel to the secondary scanning direction y. Accordingly, prolonging the optical path does not incur an increase in size of the image sensor module 104 in the thickness direction z. Further, the support member 300 is formed of an acrylic resin and hence can participate in securing a part of the rigidity of the housing 700. In this embodiment also, the support member 300 abuts against the right sidewall of the recessed portion 710 in FIG. 16 and the elevated portion 715, and thus prevents the housing 700 from being distorted. Therefore, the image sensor module 104 can be made thinner in the thickness direction 2, without compromising the rigidity of the housing 700.

Placing the support member 300 according to this embodiment in the housing 700 such that the upright surface 306 abuts against the side face 715a facilitates the positioning of the support member 300 in the housing 700. In the case of the support member 300 for example shown in FIG. 3, the support member 300 is only in contact with a corner of the elevated portion 715, and hence prone to step over the elevated portion 715 when an excessive force is applied to the support member 300 while setting the support member 300. In contrast, in the case where the support member 300 has the upright surface 306, a surface-to-surface contact is realized and therefore the support member 300 can be more accurately and stably positioned. Such a configuration reduces defects arising from the improper positioning of the support member 300 in the housing 700, thereby improving the production yield and reducing the manufacturing cost.

The support member 300 according to this embodiment includes the pair of grooves 301b, and the adhesive for bonding the bottom face 301 and the support surface 713 together is introduced in the pair of grooves 301b. Because of the pair of grooves 301b, the support member 300 is in contact with the adhesive via a larger area compared with the case where the adhesive is applied to a flat bottom face 301 such as the one shown in FIG. 17. Therefore, in the image sensor module 104 according to this embodiment, the support member 300 can be more firmly fixed to the housing 700.

Further, the upright surface 306 is perpendicular to the top face 304 on which the light from the object to be read 890 is incident. As indicated by dash-dot-dot lines in FIG. 20, the light incident on the top face 304 and deviated from the sloped surface 302 tends to proceed in the thickness direction z, and the upright surface 306 is parallel to the course of such light. Accordingly, the light introduced through the top face 304 is barely reflected by the upright surface 306, and hence emergence of stray light is suppressed in the support member 300. As stated with reference to the image sensor module 103, the emergence of stray light that does not pass through the lens unit 400 in the support member 300 leads to degradation in reading accuracy. Therefore, it is preferable to form the upright surface 306 to suppress the emergence of stray light, from the viewpoint of improving the reading accuracy.

Still further, in this embodiment the support member 300 includes the pair of grooves 301b, and the grooves 301b each include the groove upright surface 301b1. Even though the light should proceed toward the sensor IC 500 in the secondary scanning direction y along the lower face of the lens unit 400 in the support member 300, such light is reflected by the groove upright surface 301b1 and thus restricted from reaching the right end of the support member 300 in FIG. 20.

Figure 21:
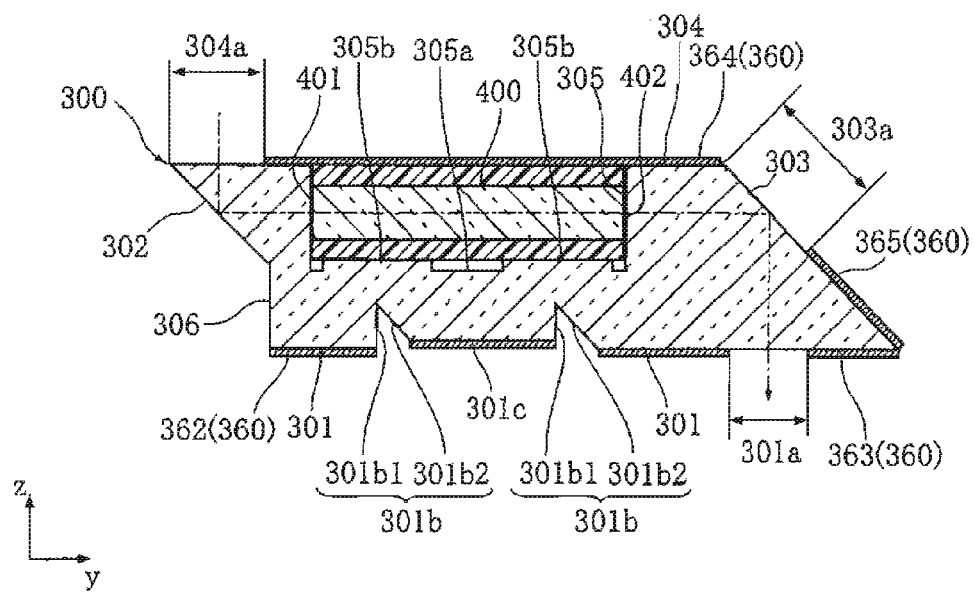
FIG. 21 is a cross-sectional view showing a variation of the support member and a light shielding member shown in FIG. 20.
Figure 22:
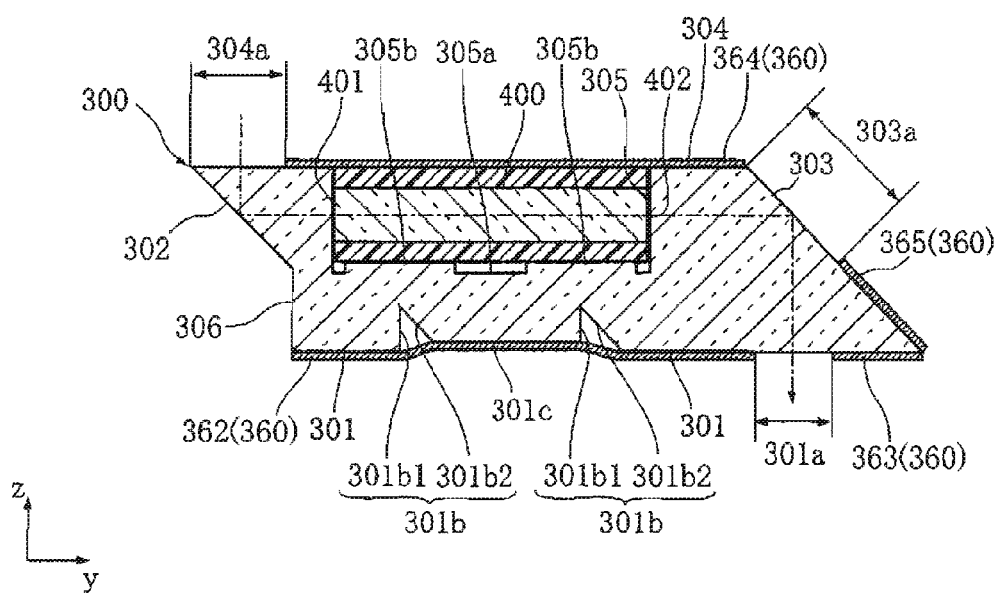
FIG. 22 is a cross-sectional view showing another variation of the support member and the light shielding member shown in FIG. 20.

FIGS. 21 and 22 illustrate a variation of the support member 300 and the light shielding member 360 shown in FIG. 20. In the example shown in FIGS. 21 and 22, the light shielding member 360 includes the bottom face anti-reflection portion 362 and the bottom face cover portion 363 that cover the bottom face 301. In the example shown in FIG. 21, the bottom face anti-reflection portion 362 is split into three belt-like regions so as to expose the pair of grooves 301b. In contrast, in the example shown in FIG. 22, the bottom face anti-reflection portion 362 is formed as a single strip so as to cover the grooves 301b. In these examples, the bottom face anti-reflection portion 362 serves to suppress reflection at the bottom face 301 as does the bottom face anti-reflection portion 362 in the image sensor module 103. Here, in the example shown in FIG. 22 the configuration of the bottom face anti-reflection portion 362 is simplified and hence the formation process of the bottom face anti-reflection portion 362 on the bottom face 301 can be simplified, however, on the other hand, the adhesive (not shown) is not introduced in the grooves 301b. In this case also, the pair of grooves 301b can prevent unnecessary light from approaching the sensor IC 500.

Figure 23:
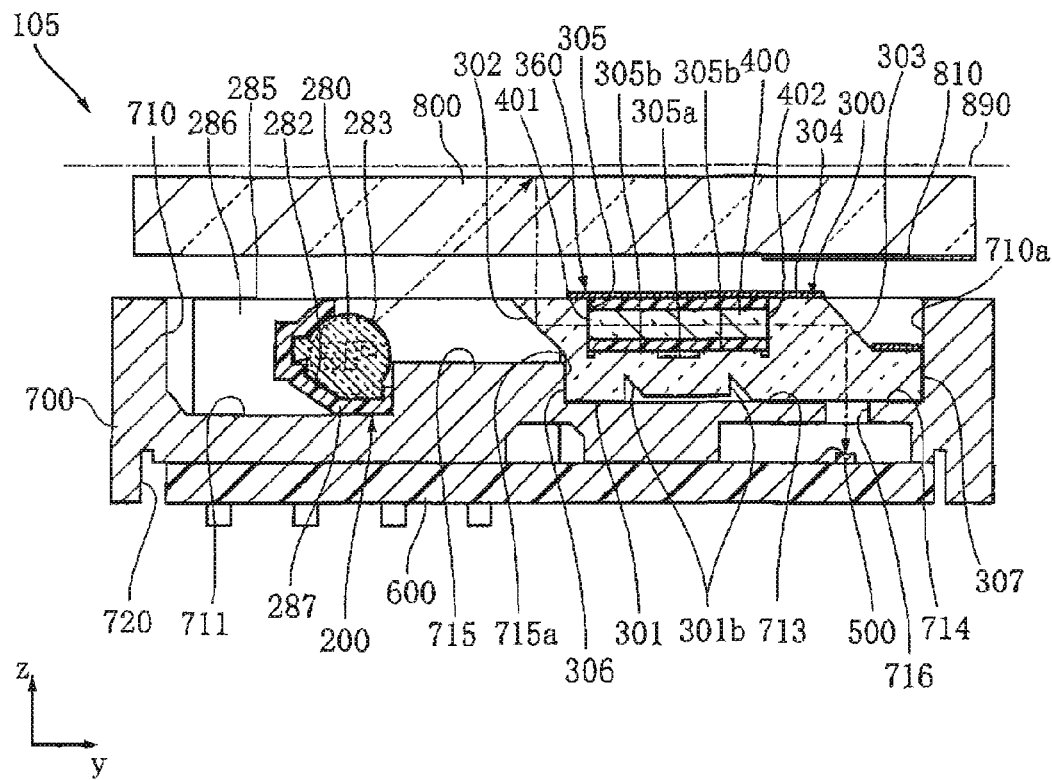
FIG. 23 is a cross-sectional view showing an image sensor module according to a fifth embodiment of the present invention.
Figure 24:
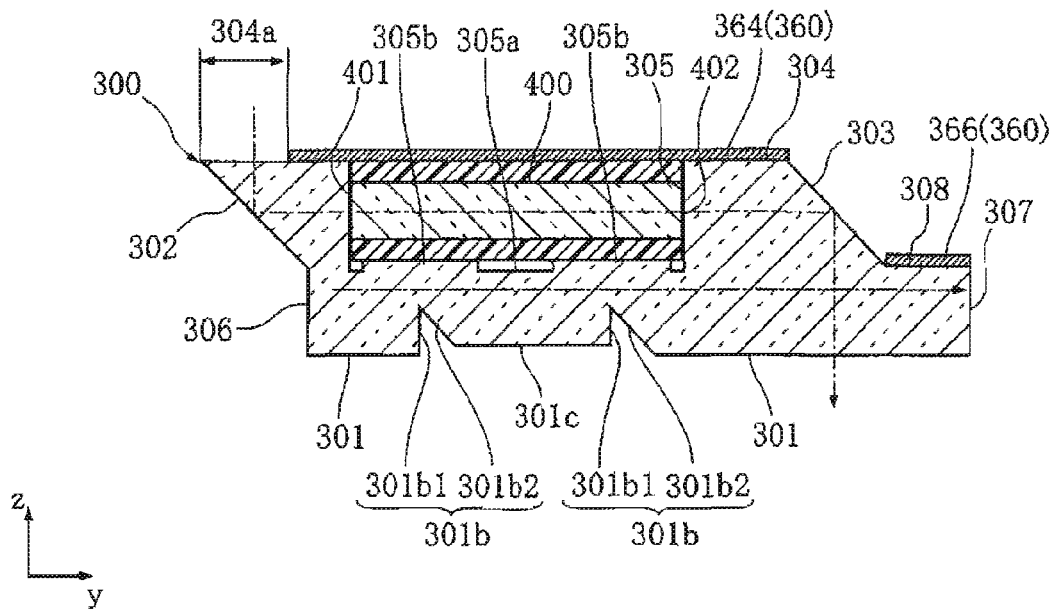
FIG. 24 is an enlarged cross-sectional view showing a support member and a lens unit shown in FIG. 23.

FIGS. 23 and 24 illustrate an image sensor module according to a fifth embodiment of the present invention. The image sensor module 105 shown in FIGS. 23 and 24 is different from the image sensor module 104 in the configuration of a part of the support member 300. The remaining portions of the image sensor module 105 are configured in the same way as those of the image sensor module 104.

The support member 300 according to this embodiment includes an upright surface 307 erected with respect to the bottom face 301 and extending in the primary scanning direction x. The upright surface 307 is located opposite to the upright surface 306 in the secondary scanning direction y across the lens unit 400. As shown in FIG. 23, the upright surface 307 is located at the right end of the support member 300 as illustrated. In this embodiment, the upper end of the upright surface 307 is at the same position as the right end of the sloped surface 303 in the thickness direction z in FIG. 23. The sloped surface 303 according to this embodiment is located so as to overlap the sloped surface 302 and the upright surface 307 is located so as to overlap the upright surface 306, when viewed in the secondary scanning direction y. The support member 300 also includes a junction surface 308 parallel to the bottom face 301 and connecting between the upper end of the upright surface 307 and the right end of the sloped surface 303 in FIG. 24.

The upright surface 307 is in contact with the housing 700. To be more detailed, the housing 700 includes a sidewall 710a oriented to the recessed portion 710 and erected from the right end of the support surface 714 in FIG. 23, and the upright surface 307 abuts against such sidewall 710a.

In this embodiment, the sloped surface 303 is shorter than that of the image sensor module 104, and instead the junction surface 308 parallel to the bottom face 301 is provided. Accordingly, the light shielding member 360 according to this embodiment includes a junction surface cover portion 366 that covers the junction surface 308, in place of the sloped surface anti-reflection portion 365. The junction surface cover portion 366 serves to shield the light proceeding from above in the thickness direction z in FIG. 23, as does the top face cover portion 364.

With the mentioned configuration, the support member 300 can be set at the intended position by squeezing the support member 300 into the housing 700 with the upright surface 307 being made to abut the sidewall 710a.

In this embodiment, further, even though stray light should proceed in the secondary scanning direction y along the lower face of the lens unit 400 (dash-dot-dot lines in FIG. 24), such stray light is incident on the upright surface 307 instead of being reflected by the sloped surface 303. Therefore, the stray light is less likely to be reflected toward the sensor IC 500, compared with the case where the stray light is incident on the sloped surface 303.

Although the upright surface 306 is in contact with the side face 715a of the elevated portion 715 in the example shown in FIG. 23, the upright surface 306 and the side face 715d may be spaced from each other in the secondary scanning direction y. Conversely, the upright surface 306 and the side face 715a may be in contact with each other and the upright surface 307 and the sidewall 710a may be spaced from each other. Making either of the upright surface 306 and the upright surface 307 abut against the housing 700 facilitates the positioning of the support member 300 in the housing 700. However, from the viewpoint of suppressing distortion of the housing 700, it is preferable that at least a part of the upright surface 306 or the sloped surface 302 is in contact with the housing 700 and at least a part of the upright surface 307 or the sloped surface 303 is in contact with the housing 700.

Figure 25:
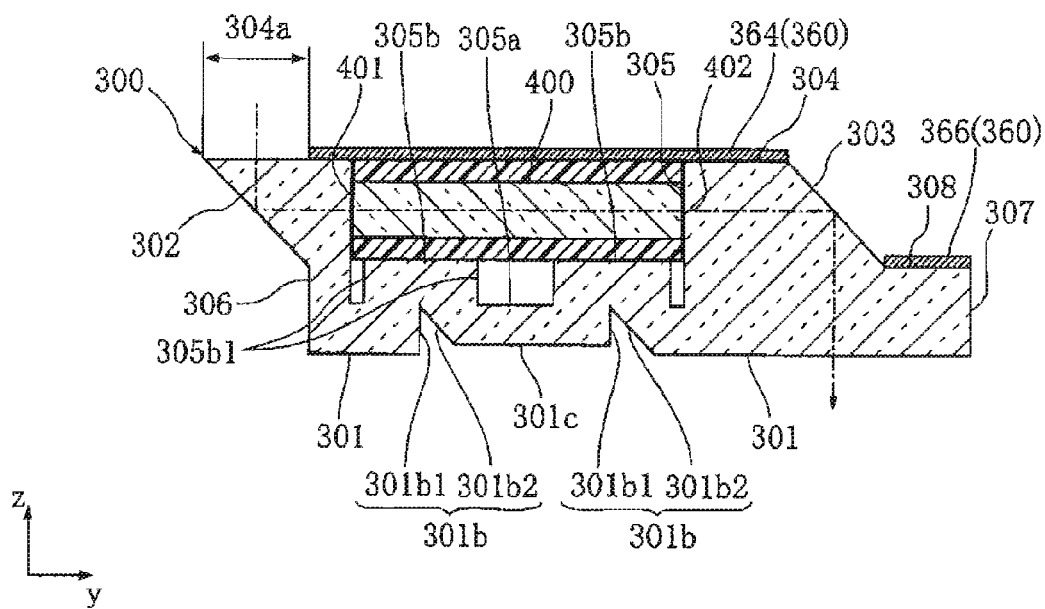
FIG. 25 is a cross-sectional view showing a variation of the support member shown in FIG. 24.

FIG. 25 illustrates a variation of the support member 300 shown in FIG. 24. The bottom elevated portion 305b of the support member 300 shown in FIG. 25 includes a pair of elevated portion upright surface 305b1 erected with respect to the bottom face 301. The lower end of the elevated portion upright surface 305b1 in the thickness direction z in FIG. 25 is, for example, generally at the same position as the upper end of the groove 301b in the thickness direction z in FIG. 25. Such a configuration further restricts stray light from passing through the region under the lens unit 400 in the support member 300 in FIG. 25.

Figure 26:
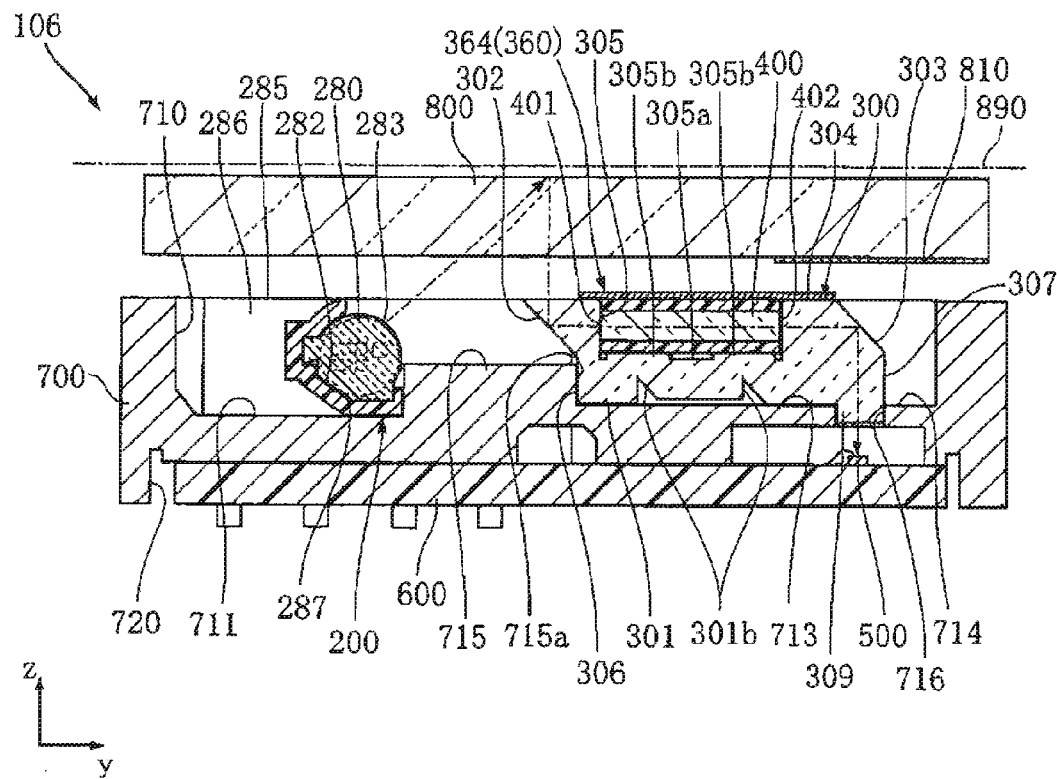
FIG. 26 is a cross-sectional view showing an image sensor module according to a sixth embodiment of the present invention.

FIG. 26 illustrates an image sensor module according to a sixth embodiment of the present invention. The image sensor module 106 shown in FIG. 26 is different from the image sensor module 104 in the configuration of a part of the support member 300 and the light shielding member 360. The remaining portions of the image sensor module 106 are configured in the same way as those of the image sensor module 104.

The support member 300 according to this embodiment includes the upright surface 307 erected with respect to the bottom face 301 and extending in the primary scanning direction x. The upright surface 307 is located opposite to the upright surface 306 in the secondary scanning direction y across the lens unit 400. As shown in FIG. 26, the upright surface 307 is located at the right end of the support member 300 as illustrated. In this embodiment, the sloped surface 303 is located so as to overlap the sloped surface 302 and the upright surface 307 is located so as to overlap the upright surface 306, when viewed in the secondary scanning direction y. The support member 300 also includes a junction surface 308 parallel to the upright surface 307 is formed so as to extend in the thickness direction z from the right end of the sloped surface 303 in FIG. 26.

Further, the support member 300 according to this embodiment includes a projecting portion 309 fitted in the groove 716 of the housing 700. The projecting portion 309 sticks out from the right end portion of the bottom face 301 toward the sensor IC 500 in the thickness direction z in FIG. 26. The right end of the projecting portion 309 in FIG. 26 is delimited by the upright surface 307.

In this embodiment, the sloped surface 303 is shorter than that of the image sensor module 104, and hence providing the sloped surface anti-reflection portion 365 is scarcely necessary. Accordingly, the light shielding member 360 according to this embodiment is only constituted of the top face cover portion 364.

With the mentioned configuration, the support member 300 can be easily positioned by fitting the projecting portion 309 in the groove 716.

In this embodiment, further, even though stray light should proceed in the secondary scanning direction y along the lower face of the lens unit 400, such stray light is incident on the upright surface 307 instead of being reflected by the sloped surface 303, as in the support member 300 shown in FIG. 24. Therefore, the stray light is less likely to be reflected toward the sensor IC 500, compared with the case where the stray light is incident on the sloped surface 303.

With the configuration according to this embodiment, the support member 300 is only supported by the support surface 713, and not by the support surface 714. Such a configuration is particularly effective in the case where, for example, the housing 700 is composed of two parts that can be split to left and right in FIG. 26. In the case where the housing 700 is composed of two separable parts, the parts may be distorted in different manners, which makes it difficult to accurately position the support member 300 with respect to both of the parts. However, with the configuration according to this embodiment it suffices that the support member 300 is accurately positioned with respect to one of the parts that includes the support surface 713, and therefore the manufacturing process can be simplified.

The provision of the upright surfaces 306, 307 on the support member 300 may be applied to similar fields, without limitation to the image sensor module. In an LED printing head for example, normal printing performance is disturbed when stray light emerges in a light guide that guides the light from the LED. Forming the upright surface on the light guide is useful for preventing such a situation.

Figure 27:
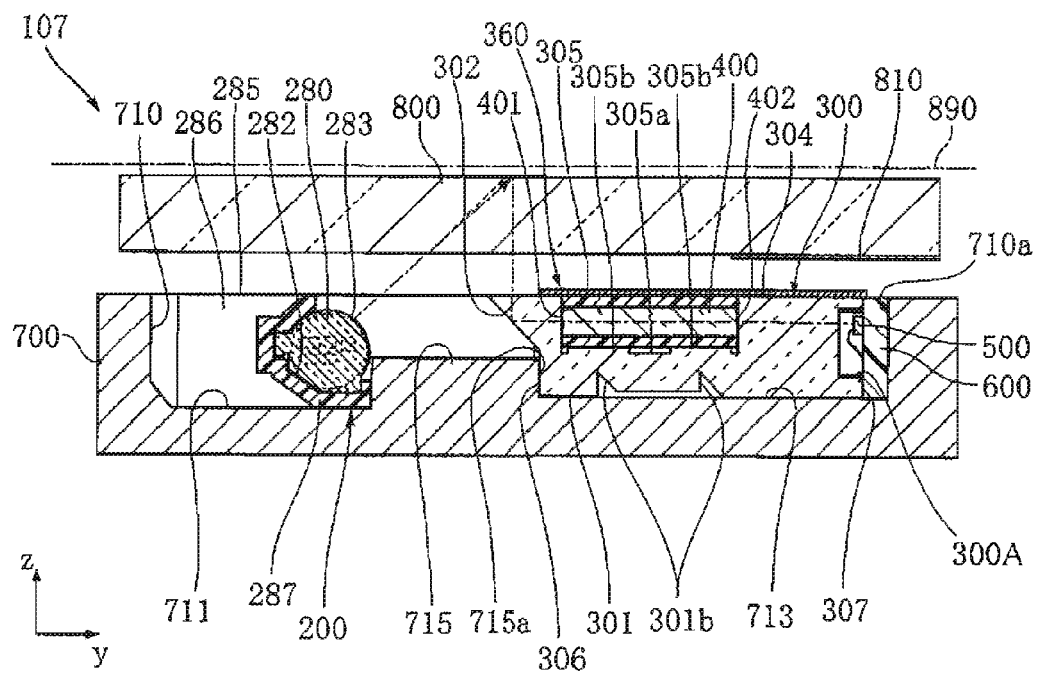
FIG. 27 is a cross-sectional view showing an image sensor module according to a seventh embodiment of the present invention.
Figure 28:
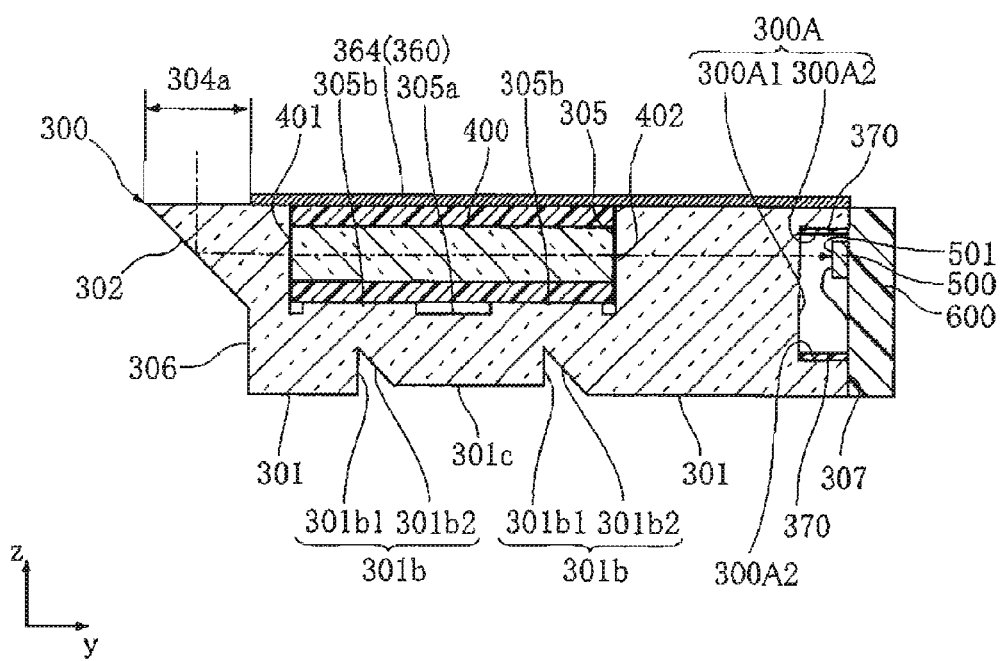
FIG. 28 is an enlarged cross-sectional view showing a support member and so forth shown in FIG. 27.

FIGS. 27 and 28 illustrate an image sensor module according to a seventh embodiment of the present invention. The image sensor module 104 shown in FIGS. 27 and 28 may be incorporated, for example, in a document scanner designed to optically read characters and images printed on the object to be read 890 to thereby generate electronic data containing those characters and images, as are the image sensor modules 101 to 106. While the substrate 600 is fitted in the recessed portion 720 of the housing 700 in the image sensor modules 101 to 106, the substrate 600 supporting the sensor IC 500 is fixed to the support member 300 in the image sensor module 107. Except for such a difference in configuration, the basic structure of the image sensor module 107 is similar to that of the image sensor module 105. FIG. 28 is an enlarged cross-sectional view of the support member 300, the lens unit 400, and the substrate 600 shown in FIG. 27. Referring to FIGS. 27 and 28, the difference between the image sensor module 107 and the image sensor module 105 will be described hereunder.

As shown in FIG. 27, the housing 700 according to this embodiment does not have the recessed portion 720, and the substrate 600 is located in the recessed portion 710.

The support member 300 according to this embodiment does not have the sloped surface 303 but instead includes the upright surface 307 erected with respect to the bottom face 301, as shown in FIG. 28. Since the support member 300 does not have the sloped surface 303, the light shielding member 360 according to this embodiment is only constituted of the top face cover portion 364.

The support member 300 according to this embodiment further includes a recessed portion 300A formed so as to recede in the secondary scanning direction y from the upright surface 307. The support member 300 includes a recessed output surface 300A1 perpendicular to the secondary scanning direction y and recessed sidewalls 300A2 erected with respect to the recessed output surface 300A1, and thus the recessed portion 300A is composed of the recessed output surface 300A1 and the recessed sidewalls 300A2. The recessed output surface 300A1 has an elongate rectangular shape extending in the primary scanning direction x, and the recessed sidewalls 300A2 extend in the secondary scanning direction y from the respective sides of the recessed output surface 300A1. The cross-section shown in FIG. 28 includes two end faces of the recessed sidewalls 300A2 extending from the respective longer sides of the recessed output surface 300A1.

The substrate 600 according to this embodiment is fixed to the upright surface 307, for example via a non-illustrated adhesive. The sensor IC 500 according to this embodiment is mounted on the surface of the substrate 600 facing the upright surface 307, and is accommodated in the recessed portion 300A. A photodetecting surface 501 of the sensor IC 500 is configured to face the recessed output surface 300A1. The surface of the substrate 600 opposite to the sensor IC 500 abuts against the sidewall 710a of the recessed portion 710.

Here, the substrate 600 according to this embodiment corresponds to the sensor IC support base in the present invention.

In this embodiment, the light outputted from the output surface 402 of the lens unit 400 proceeds in the secondary scanning direction y and is outputted through the recessed output surface 300A1 so as to proceed in the secondary scanning direction y, and then is incident on the photodetecting surface 501 of the sensor IC 500.

The image sensor module 107 according to this embodiment includes an anti-reflection member 370 provided in the recessed portion 300A. The anti-reflection member 370 is formed so as to expose the recessed output surface 300A1 and to cover the recessed sidewalls 300A2. The anti-reflection member 370 has, for example, a frame shape formed so as to surround the sensor IC 500, and is fitted in the recessed portion 300A such that the outer periphery is in contact with the recessed sidewalls 300A2. The anti-reflection member 370 may be formed of a black resin for example, and serves to prevent the light outputted from the recessed output surface 300A1 from being reflected by the recessed sidewalls 300A2, and to shield the light outputted from the recessed sidewalls 300A2. As described above, the light to be detected by the sensor IC 500 is the light proceeding from the lens unit 400 straightly in the secondary scanning direction y. The light of a direction to be reflected by the recessed sidewalls 300A2, or the light outputted through the recessed sidewalls 300A2 is stray light that should not be incident on the sensor IC 500. The anti-reflection member 370 is provided in order to prevent such stray light from reaching the sensor IC 500.

In this embodiment also, the optical path arranged from the object to be read 890 to the sensor IC 500 is bent, and the section passing through the lens unit 400 is parallel to the secondary scanning direction y. Accordingly, prolonging the optical path does not incur an increase in size of the image sensor module 107 in the thickness direction z. Further, the support member 300 is formed of an acrylic resin and hence can participate in securing a part of the rigidity of the housing 700. In this embodiment, the upright surface 306 in the vicinity of the left end portion of the support member 300 in FIG. 27 abuts against the side face 715a of the elevated portion 715, and the substrate 600 fixed to the upright surface 307 at the right end in FIG. 27 abuts against the sidewall 710a, and thus the housing 700 is prevented from being distorted. Therefore, the image sensor module 107 can be made thinner in the thickness direction z, without compromising the rigidity of the housing 700.

In the image sensor module 107 according to this embodiment, since the substrate 600 is fixed to the support member 300 it is not mandatory to set the support member 300 accurately in position when placing the support member 300 in the housing 700. In the image sensor modules 101 to 106, for example in the case where the support member 300 is fixed in an inclined posture, the light that has passed through the lens unit 400 may fail to be incident on the sensor IC 500. However, with the configuration according to this embodiment, the substrate 600 is fixed to the support member 300 before being fixed to the housing 700. In case that the light from the lens unit 400 fails to be incident on the sensor IC 500, such a defect can be detected before the support member 300 is placed in the housing 700. Therefore, the configuration according to this embodiment simplifies the process of setting the support member 300 in the housing 700, thereby contributing to improving the production yield by facilitating the manufacturing process and reducing the defect rate.

The anti-reflection member 370 is a frame-shaped member formed of a resin in this embodiment, however a black resin may be applied to the recessed sidewalls 300A2 so as to serve as the anti-reflection member 370.

Figure 29:
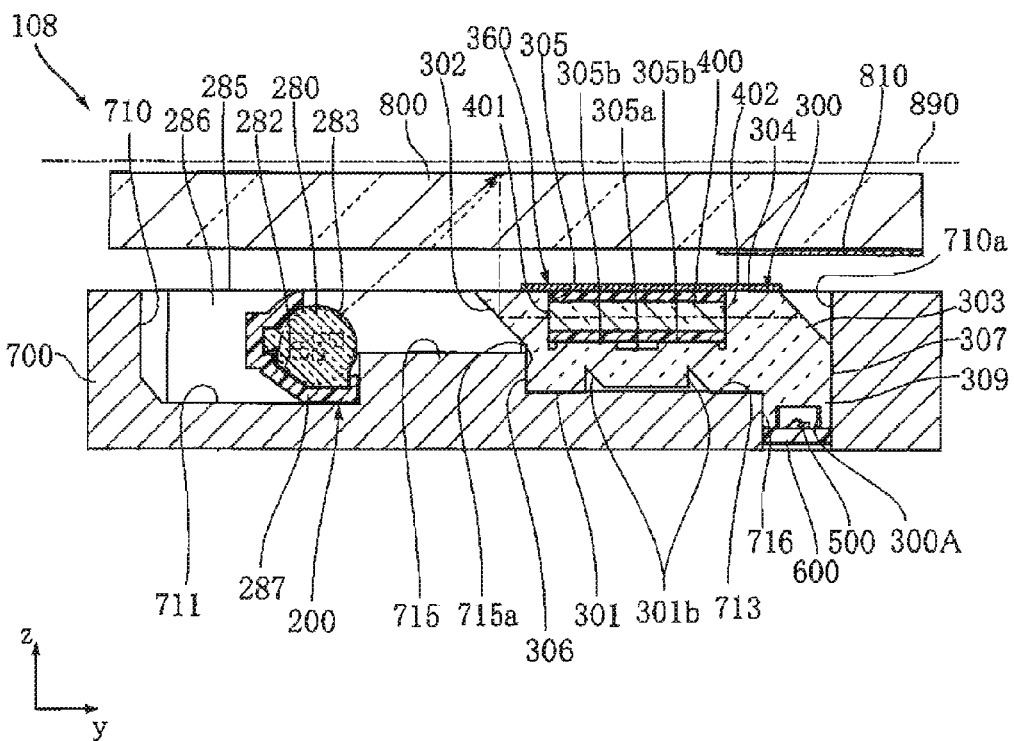
FIG. 29 is a cross-sectional view showing an image sensor module according to an eighth embodiment of the present invention.
Figure 30:
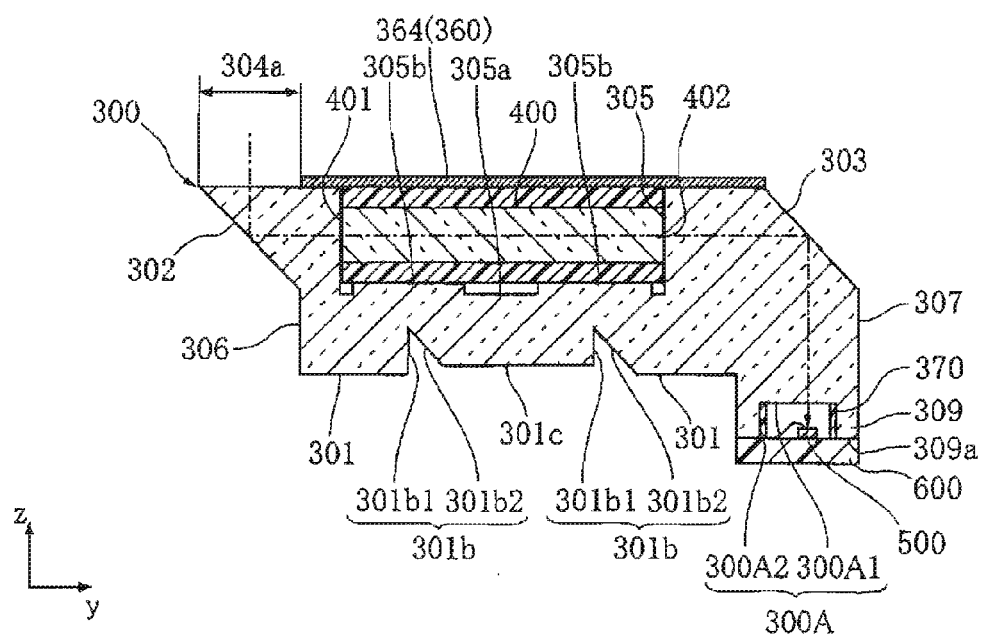
FIG. 30 is an enlarged cross-sectional view showing a support member and so forth shown in FIG. 29.

FIGS. 29 and 30 illustrate an image sensor module according to an eighth embodiment of the present invention. The image sensor module 106 shown in FIGS. 29 and 30 is different from the image sensor module 107 in the configuration of the support member 300 and the housing 700, and the remaining portions are configured in the same way as the image sensor module 107.

The support member 300 according to this embodiment includes, as shown in FIG. 30, the sloped surface 303 inclined with respect to the bottom face 301 and the upright surface 307, and a projecting portion 309 sticking out downward as illustrated from the bottom face 301. To accommodate the support member 300 thus configured, the housing 700 according to this embodiment includes the groove 716 in which the projecting portion 309 is fitted. The sloped surface 303 according to this embodiment sloped surface 303 is configured in the same way as the sloped surface 303 of the support member 300 shown in FIG. 24.

The projecting portion 309 includes a lower surface 309a parallel to the bottom face 301, and the support member 300 according to this embodiment is fixed to the lower surface 309a via a non-illustrated adhesive. The recessed portion 300A according to this embodiment is formed so as to recede upward from the lower surface 309a in the thickness direction z in FIG. 30. The recessed output surface 300A1 according to this embodiment is parallel to the bottom face 301. Further, the upright surface 307 according to this embodiment connects between the lower end of the sloped surface 303 and the right end of the lower surface 309a in FIG. 30.

In this embodiment, the light from the output surface 402 of the lens unit 400 proceeds in the secondary scanning direction y and reflected by the sloped surface 303 so as to proceed in the thickness direction z. The light reflected by the sloped surface 303 proceeds straightly downward in the thickness direction z in FIG. 29, and is outputted through the recessed output surface 300A1 toward the sensor IC 500.

In order to secure a sufficient optical path length of the lens unit 400 in the configuration of the image sensor module 107, it is often necessary to increase the size of the image sensor module in the secondary scanning direction y. However, in the image sensor module 108 the light from the output surface 402 is reflected by the sloped surface 303 in the thickness direction z, for example like the image sensor module 105, and therefore the increase in size in the secondary scanning direction y can be avoided.

FIGS. 31 and 32 illustrate an image sensor module according to a ninth embodiment of the present invention. The image sensor module 109 shown in FIGS. 31 and 32 may be incorporated, for example, in a document scanner designed to optically read characters and images printed on the object to be read 890 to thereby generate electronic data containing those characters and images, as are the image sensor modules 101 to 108. In the image sensor modules 101 to 108 the support member 300 supports the lens unit 400, however the image sensor module 109 includes a light guide or light guide member 380 in place of the support member 300 and the lens unit 400. Except for such a difference in configuration, the basic structure of the image sensor module 109 is similar to that of the image sensor module 108. FIG. 32 is an enlarged cross-sectional view of the light guide member 380 shown in FIG. 31. Referring to FIGS. 31 and 32, the difference between the image sensor module 109 and the image sensor module 108 will be described hereunder.

The light guide member 380 is formed of a transparent acrylic resin, in an elongate bar shape extending in the primary scanning direction x. The light guide member 380 includes a bottom face 381 disposed in contact with the housing 700, a sloped surface 382, a sloped surface 383, a top face 384, an upright surface 386, an upright surface 387, and a projecting portion 389 sticking out downward from the bottom face 381 in the thickness direction z in FIG. 32. The light guide member 380 according to this embodiment is configured similarly to the support member 300 shown in FIG. 30. However, while the support member 300 is a constituent for supporting the lens unit 400, the light guide member 380 is configured so as to perform as the lens unit 400 does.

The bottom face 381 corresponds to the bottom face 301 of the support member 300. The bottom face 381 includes a pair of grooves 381b corresponding to the pair of grooves 301b of the support member 300. The grooves 381b each include a groove upright surface 381b corresponding to the groove upright surface 301b1 and a groove upright surface 381b2 corresponding to the groove sloped surface 301b2. The bottom face 381 also includes a belt-like region 381c corresponding to the belt-like region 301c, between the pair of grooves 381b. A non-illustrated adhesive for bonding the bottom face 381 and the support surface 713 together is introduced in the gap between the belt-like region 381c and the support surface 713. The grooves 381b serve to increase the contact area between the bottom face 381 and the adhesive. Further, the groove upright surfaces 381b1 of the respective grooves 381b serve to prevent stray light from proceeding in the light guide member 380 through an unintended route.

The sloped surface 382 corresponds to the sloped surface 302 of the support member 300, and the sloped surface 383 corresponds to the sloped surface 303 of the support member 300. The top face 384 corresponds to the top face 304 of the support member 300. While the support member 300 shown in FIG. 30 includes the recessed portion 305 formed so as to recede from the top face 304 in the thickness direction z for accommodating the lens unit 400, the light guide member 380 does not have a recessed portion. The light guide member 380 includes an entrance portion 384a located at the left end of the top face 384 in FIG. 32, so as to oppose the object to be read 890. The entrance portion 384a includes an entrance lens surface 391. The sloped surface 382 serves as a reflection surface that reflects the light from the entrance portion 384a in the secondary scanning direction y, and the sloped surface 383 serves as an additional reflection surface spaced from the sloped surface 382 in the secondary scanning direction y. The sloped surface 383 reflects the light proceeding in the secondary scanning direction y so as to proceed in the thickness direction z.

The upright surface 386 corresponds to the upright surface 306 of the support member 300, and the upright surface 387 corresponds to the upright surface 307 of the support member 300. The upright surface 386 and the upright surface 387 are perpendicularly erected with respect to the bottom face 381. The upright surface 386 abuts against the side face 715a of the elevated portion 715 of the housing 700, and the upright surface 387 abuts against the sidewall 710a of the recessed portion 710 on the right in FIG. 31.

The projecting portion 389 corresponds to the projecting portion 309 of the support member 300. The substrate 600 is fixed to a lower surface 389a of the projecting portion 389 in the thickness direction z in FIG. 32, via a non-illustrated adhesive. The light guide member 380 includes a recessed portion 380A formed so as to recede upward from the lower surface 389a of the projecting portion 389 in the thickness direction z in FIG. 32. The recessed portion 380A corresponds to the recessed portion 300A of the support member 300. The light guide member 380 includes a recessed output surface 380A1 perpendicular to the thickness direction z and recessed sidewalls 380A2 erected with respect to the recessed portion output surface 380A1, and thus the recessed portion 380A is composed of the recessed portion output surface 380A1 and the recessed sidewalls 380A2. The recessed output surface 380A1 corresponds to the recessed output surface 300A1 of the support member 300, and the recessed sidewalls 380A2 correspond to the recessed sidewalls 300A2 of the support member 300.

The recessed output surface 380A1 is spaced from the entrance portion 384a in the secondary scanning direction y, and corresponds to the output portion in the present invention. The recessed output surface 380A1 includes an output lens surface 392. The substrate 600 supports the sensor IC 500, which is accommodated in the recessed portion 380A. The sensor IC 500 receives the light from the output lens surface 392. Further, the anti-reflection member 370 similar to that of the support member 300 is provided in the recessed portion 380A.

In the image sensor module 109 according to this embodiment, the entrance lens surface 391 and the output lens surface 392 serve as the lens unit 400 in the image sensor module 108. The optical path between the entrance lens surface 391 and the output lens surface 392 is bent by the sloped surface 382 and the sloped surface 383, and includes a section parallel to the secondary scanning direction y. Accordingly, prolonging the optical path does not incur an increase in size of the image sensor module 109 in the thickness direction z. Further, the support member 380 is formed of an acrylic resin and hence can participate in securing a part of the rigidity of the housing 700. In this embodiment, the upright surface 386 abuts against the side face 715a of the elevated portion 715, and the upright surface 387 abuts against the sidewall 710a, and thus the housing 700 is prevented from being distorted. Therefore, the image sensor module 107 can be made thinner in the thickness direction z, without compromising the rigidity of the housing 700.

In this embodiment, the substrate 600 is fixed to the light guide member 380. Accordingly, it is not mandatory to perform accurate positioning when placing the light guide member 380 in the housing 700. Further, with the configuration including the lens unit 400 and the support member 300, the lens unit 400 has to be accurately fixed to the support member 300. However, the process of such accurate positioning can be skipped by employing the light guide member 380. Therefore, the configuration according to this embodiment simplifies the process of setting the support member 300 in the housing 700, thereby contributing to improving the production yield by facilitating the manufacturing process and reducing the defect rate.

Figure 33:
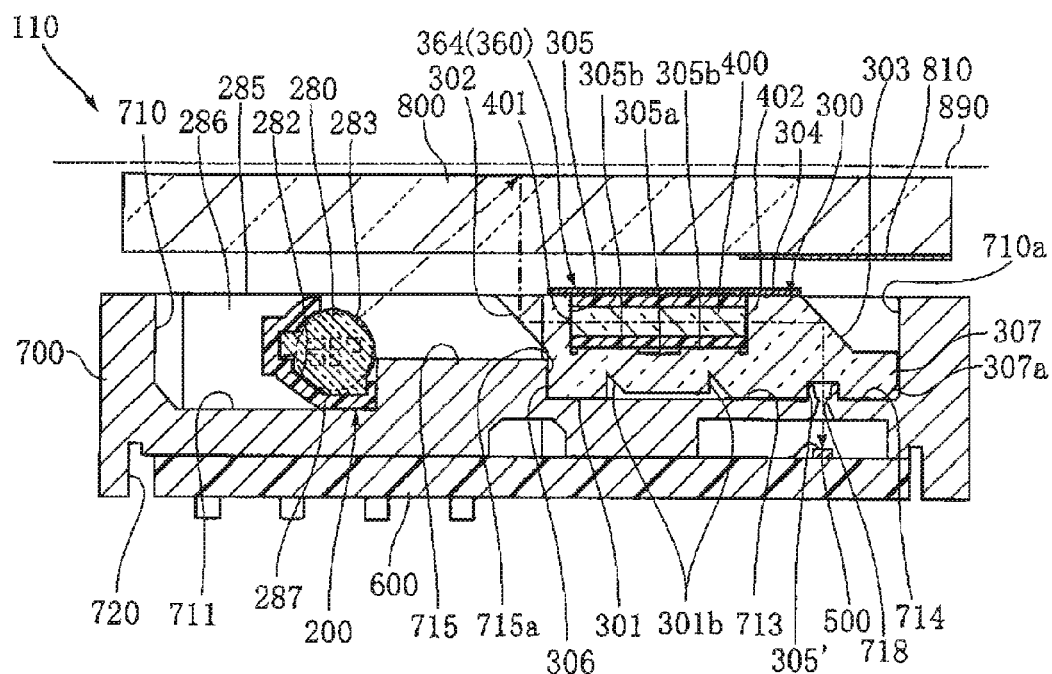
FIG. 33 is a cross-sectional view showing an image sensor module according to a tenth embodiment of the present invention.
Figure 34:
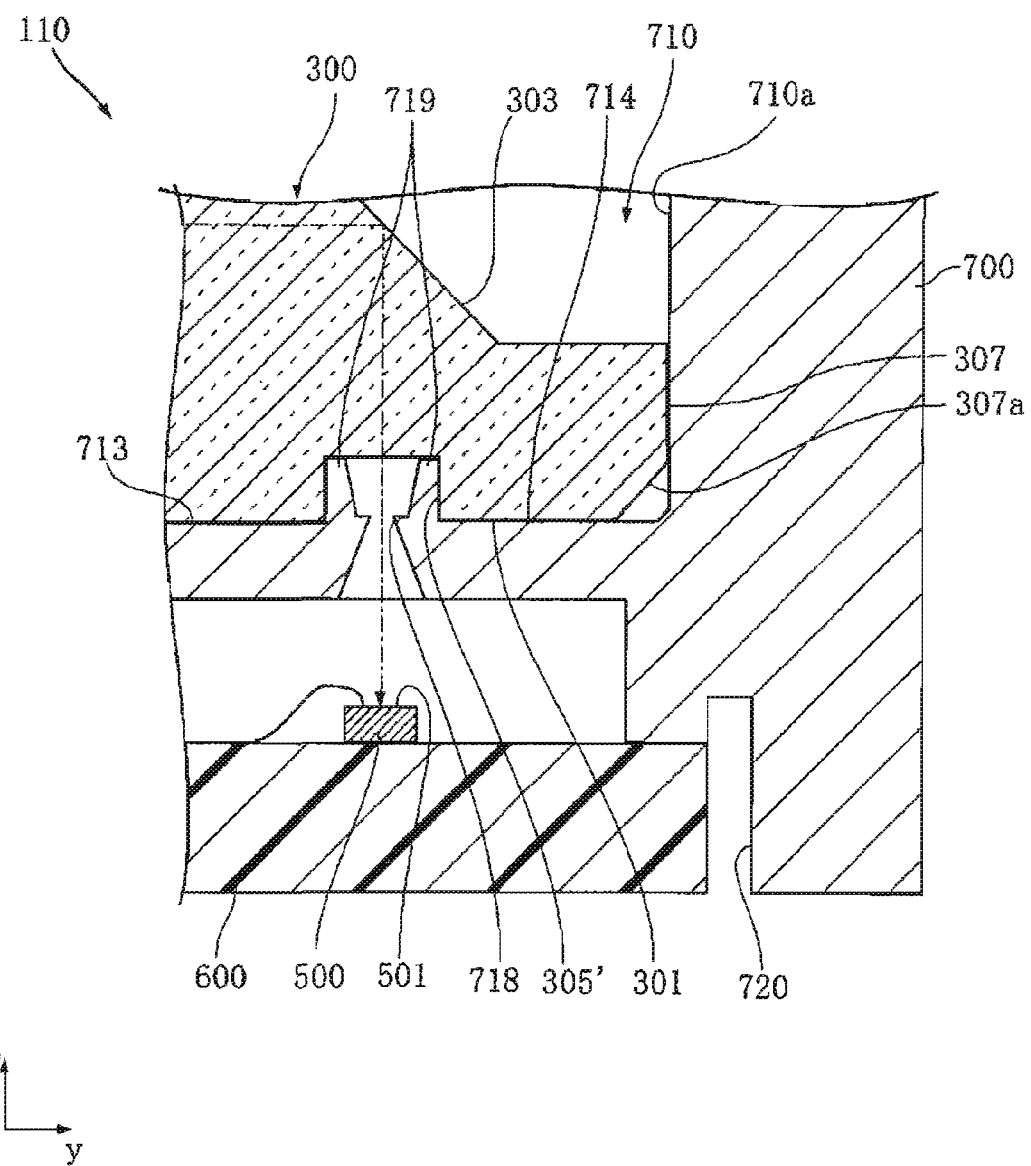
FIG. 34 is an enlarged fragmentary cross-sectional view of the image sensor module shown in FIG. 33.

FIGS. 33 to 35 illustrate an image sensor module according to a tenth embodiment of the present invention. The image sensor module 110 shown in FIGS. 33 to 35 is different from the image sensor module 105 in the configuration of a part of the support member 300 and the housing 700. The remaining portions of the image sensor module 110 are configured in the same way as those of the image sensor module 105.

The support member 300 according to this embodiment includes a recessed portion 305' extending in the primary scanning direction x and receding in the direction opposite to the sensor IC 500. As shown in FIGS. 34 and 35, the recessed portion 305' has a rectangular cross-section. The recessed portion 305' is formed over generally the entire length of the support member 300 in the primary scanning direction x. The recessed portion 305' is disposed on the route of the light reflected by the sloped surface 303 and proceeding toward the sensor IC 500.

As shown in FIG. 34, the support member 300 according to this embodiment includes a chamfered portion 307a formed between the upright surface 307 and the bottom face 301. The chamfered portion 307a serves to prevent collision between the corner of the support member 300 and the corner between the sidewall 710a and the support surface 714 of the recessed portion 710. Forming the chamfered portion 307a allows the support member 300 to be more smoothly fitted in the recessed portion 710.

As described with reference to the image sensor module 101, the sensor IC 500 includes the plurality of photodetecting surfaces. In FIG. 34, the photodetecting surface is denoted by a reference numeral 501. The photodetecting surface 501 is oriented upward in FIG. 34, so as to receive the light incident thereon from above.

The housing 700 according to this embodiment includes a slit 718 facing the sensor IC 500 and a pair of wall portions 719 fitted in the recessed portion 305'. The wall portions 719 each extend in the primary scanning direction x generally over the entire length of the housing 700. As shown in FIG. 35, the wall portions 719 each include a side face 719a perpendicular to the secondary scanning direction y. In this embodiment, the side face 719a of each of the wall portions 719 abuts against the sidewall of the recessed portion 305'.

The slit 718 serves to allow the light reflected by the sloped surface 303 and proceeding toward the photodetecting surface 501 of the sensor IC 500 to pass therethrough, and is formed so as to extend in the primary scanning direction x generally over the entire length of the housing 700. As shown in FIG. 35, the slit 718 includes a pair of sloped surfaces 718a, a pair of sloped surfaces 718b, and a pair of horizontal surfaces 718c. The sloped surfaces 718a are inclined so as to be more distant from each other in the secondary scanning direction y, toward the sensor IC 500 in the thickness direction z. The sloped surfaces 718b are inclined so as to be closer to each other in the secondary scanning direction y, toward the sensor IC 500 in the thickness direction z. The sloped surfaces 718b are located at positions more distant from the sensor IC 500 in the thickness direction z, than the sloped surfaces 718a. Here, the sloped surfaces 718b respectively correspond to the surfaces of the wall portions 719 opposite to the side face 719a.

The horizontal surface 718c each extend in the primary scanning direction x and are perpendicular to the thickness direction z. As shown in FIG. 35, the horizontal surface 718c on the left is located between the left one of the pair of sloped surfaces 718a and the left one of the pair of sloped surfaces 718b. The horizontal surface 718c on the right in FIG. 35 is located between the right one of the pair of sloped surfaces 718a and the right one of the pair of sloped surfaces 718b.

In this embodiment, as shown in FIG. 35, the clearance between the pair of sloped surfaces 718a at the upper end in the thickness direction z is narrower than the clearance between the pair of sloped surfaces 718b at the lower end in the thickness direction z. Therefore, the horizontal surfaces 718c are oriented upward in FIG. 35, as is the photodetecting surface 501.

The housing 700 according to this embodiment may be manufactured by combining two molds and introducing a resin therebetween. In this case, the slit 718 can be formed by making the protruding portion of each mold abut each other. To be more detailed, the protruding portion of one or the molds has a shape that defines the pair of sloped surfaces 718a, and the protruding portion of the other mold has a shape that defines the pair of sloped surfaces 718b. It is preferable to form the leading end portion of the protruding portions of the respective molds in different width, because the protruding portions may be shifted from each other upon being made to abut each other. It is because the width of the protruding portion of one of the molds is narrower than that of the protruding portion of the other mold, that the pair of horizontal surfaces 718c is formed.

In this embodiment, the pair of wall portions 719 of the housing 700 is fitted in the recessed portion 305' of the support member 300 when placing the support member 300 in the housing 700. Accordingly, the support member 300 can be more easily and more accurately positioned with respect to the housing 700. In particular, the slit 718 formed between the pair of wall portions 719 serves as the path for the light passing through the lens unit 400 to reach the sensor IC 500. Utilizing the pair of wall portions 719a for the positioning enables the support member 300 to be more accurately positioned with respect to the slit 718.

In this embodiment, further, the slit 718 includes the pair of sloped surfaces 718b, which makes the lower end portion thereof narrower than the upper end portion in FIG. 35 through which the light enters. Because of such a configuration the slit 718 serves as a diaphragm that blocks a part of the light from the sloped surface 303, and contributes to preventing unnecessary light from reaching the sensor IC 500.

Still further, in this embodiment the side faces 719a of the respective wall portions 719 abut against the sidewall of the recessed portion 305', thus blocking the light proceeding toward the slit 718 through the sidewall of the recessed portion 305'. Accordingly, stray light proceeding through inside of the support member 300 is restricted from intruding into the slit 718.

Figure 36:
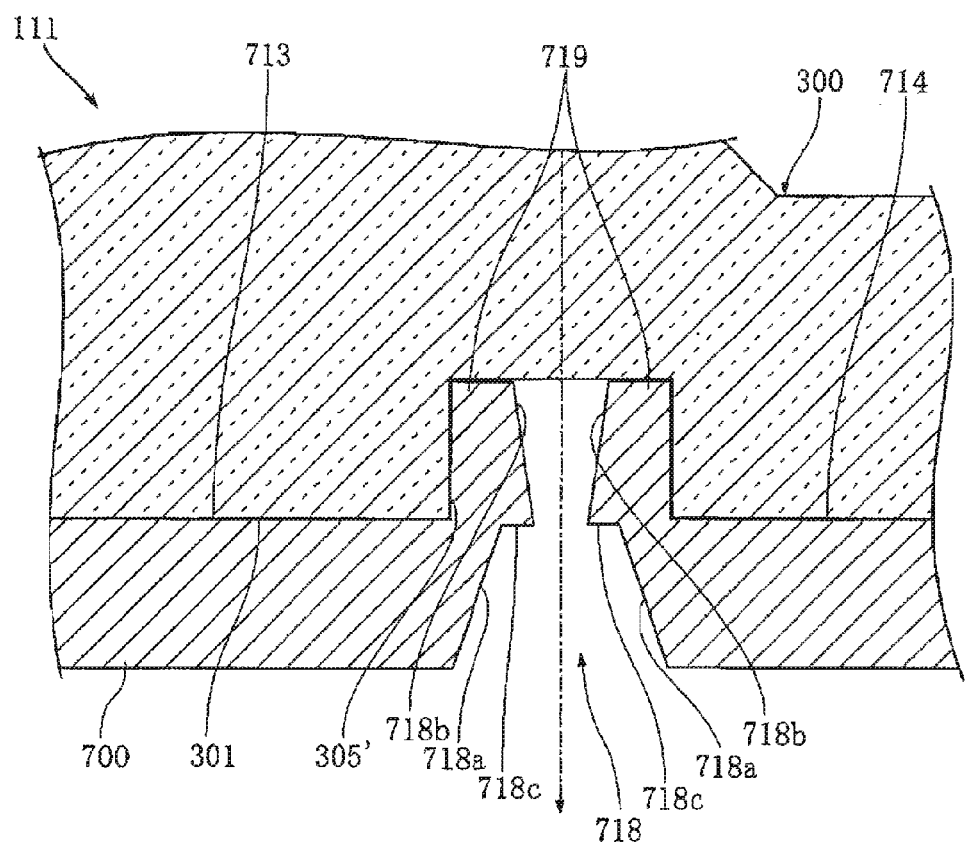
FIG. 36 is a fragmentary cross-sectional view showing an image sensor module according to an eleventh embodiment of the present invention.

FIG. 36 illustrates an image sensor module according to an eleventh embodiment of the present invention. The image sensor module 111 shown in FIG. 36 is different from the image sensor module 110 in the configuration of the slit 718, and the remaining portions are configured in the same way as the image sensor module 110.

In this embodiment, as shown in FIG. 36, the clearance between the pair of sloped surfaces 718a at the upper end in the thickness direction z is wider than the clearance between the pair of sloped surfaces 718b at the lower end in the thickness direction z, contrary to the configuration of the image sensor module 110. Therefore, the horizontal surfaces 718c according to this embodiment are configured to face the photodetecting surface 501. The slit 718 of such a shape can be formed by two molds in which the widths of the protruding portions are inverted from those of the molds for the image sensor module 110.

Figure 37:
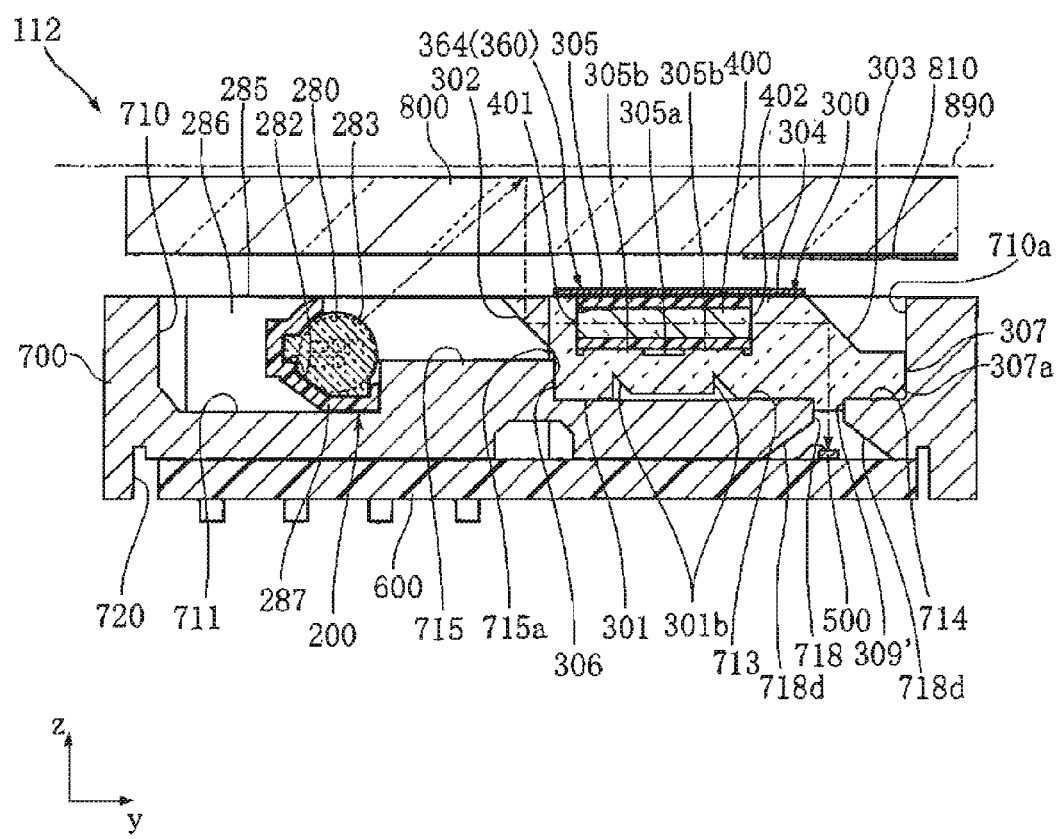
FIG. 37 is a cross-sectional view showing an image sensor module according to a twelfth embodiment of the present invention.
Figure 38:
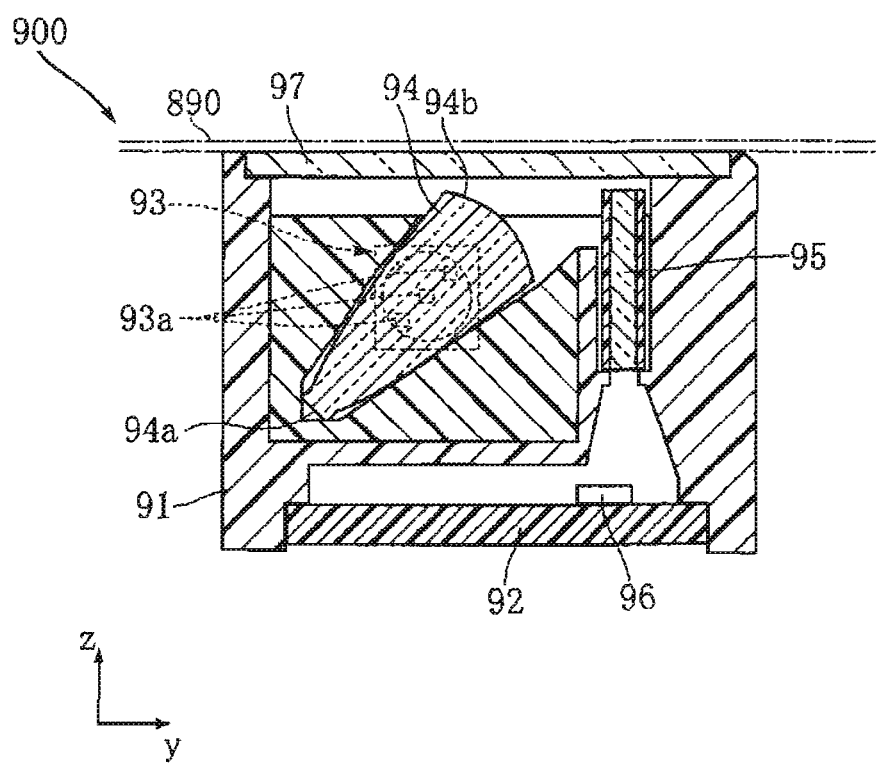
FIG. 38 is a cross-sectional view showing an example of a conventional image sensor module.

FIG. 37 illustrates an image sensor module according to a twelfth embodiment of the present invention. The image sensor module 112 shown in FIG. 37 is different from the image sensor module 110 in the configuration of the vicinity of the slit 718, and the remaining portions are configured in the same way as the image sensor module 110.

As shown in FIG. 37, the housing 700 according to this embodiment includes the slit 718 facing the sensor IC 500 and a pair of sloped surfaces 718d extending from the lower end of the slit 718 as illustrated. The sloped surfaces 718d are inclined so as to be more distant from each other toward a lower position in FIG. 37. The sensor IC 500 is accommodated in the space between the pair of sloped surfaces 718d.

The support member 300 according to this embodiment includes a projecting portion 309' protruding downward from the bottom face 301 in FIG. 37. The projecting portion 309' is disposed on the route of the light reflected by the sloped surface 303 and proceeding toward the sensor IC 500, and extending into the slit 718.

With the configuration according to this embodiment, the projecting portion 309' is fitted in the slit 718 when the support member 300 is to be placed in the housing 700, and therefore the support member 300 can be more easily and more accurately positioned with respect to the housing 700.

The image sensor module according to the present invention is in no way limited to the foregoing embodiments. The specific configuration of the constituents of the image sensor module according to the present invention may be modified in various manners. For example, although the light source unit 200 is located inside the housing 700 and the Lens unit 400 is configured to form the image based on the reflected light from the object to be read 890 on the sensor IC 500 in the foregoing embodiments, the image sensor module according to the present invention is not limited to such a configuration. The light source unit may be located on the opposite side of the lens unit and the sensor IC across the object to be read 890, and the lens unit may form the image based on the light transmitted through the object to be read 890 on the sensor IC.

In the foregoing embodiments, the sloped surfaces 312, 313 are located on the respective sides of the transmissive portion 310 in the secondary scanning direction y, and the reflection surfaces 321, 331 are formed along the sloped surface 312, 313, respectively. However, the present invention is not limited to such a configuration. For example, one of the sides of the transmissive portion 310 in the secondary scanning direction y may be formed in an orientation perpendicular to the secondary scanning direction y. In this case, the same effect as that provided by the reflection surfaces 321, 331 can be attained by, for example, forming sloped surfaces of the same inclination as the sloped surfaces 312, 313 on the housing 700 and providing the non-transmissive layer on such sloped surfaces.

Although the sloped surface 302 serves as the reflection surface in the image sensor modules 104 to 112, the reflection surface 321 in the image sensor modules 101, 102 may be adopted.

Further, although the light shielding member 360 does not cover the bottom face 301 in the image sensor module 105, the light shielding member 360 may include the bottom face anti-reflection portion 362 and the bottom face cover portion 363, as the examples shown in FIGS. 21 and 22. Likewise, the bottom face anti-reflection portion 362 may be provided in the image sensor modules 106 to 112. Still further, the bottom face anti-reflection portion 362 may be provided on the bottom face 381 of the light guide member 380, in the image sensor module 109.

LIST OF REFERENCE SIGNS x Primary scanning direction
y Secondary scanning direction
z Thickness direction
101 to 112 Image sensor module
200 Light source unit
210 LED module
221, 222, 223 LED chip
224, 225 Zener diode
231, 232, 233 Surface substrate
234 Back substrate
235, 237 Surface substrate
236, 238 Back substrate
241, 242, 243, 244 Lead
251 Mounting portion
252, 253, 254 Wire bonding portion
255, 256, 257, 258 Terminal portion
261 Conductive layer
262 Dielectric layer
265 Wire
270 Resin package
271 Opening
272 Positioning hole
280 Light guide
281 Incidence surface
282 Reflection surface
283 Output surface
285 Reflector
286 Base portion
287 Semicylindrical portion
288 Projection
300 Support member
300A Recessed portion
300A1 Recessed output surface
300A2 Recessed sidewall
301 Bottom face
301a Output portion
301b Groove
301b1 Groove upright surface
301b2 Groove sloped surface
301c Belt-like region
302 Sloped surface
302a Reflection surface
303 Sloped surface
303a Reflection surface
304 Top face
304a Entrance portion
305, 305' Recessed portion
305a Recessed portion bottom face
305b Elevated portion
305b1 Elevated portion upright surface
306, 307 Upright surface
307a Sloped surface
308 Junction surface
309, 309' Projecting portion
309a Lower surface
310 Transmissive portion
311 Bottom face
312, 313 Sloped surface
314 Cavity
315 Hole
316 Recessed portion
320, 330 Non-transmissive layer
321, 331 Reflection surface
340, 350 Mold
341, 351 Recessed portion
342, 352 Support pin
360 Light shielding member
361 Sloped surface anti-reflection portion
362 Bottom face anti-reflection portion
363 Bottom face cover portion
364 Top face cover portion
365 Sloped surface anti-reflection portion
366 Junction surface cover portion
370 Anti-reflection member
380 Light guide member
380A Recessed portion
380A1 Recessed portion output surface
380A2 Recessed sidewall
381 Bottom face
381b Groove
381b1 Groove upright surface
381b2 Groove sloped surface
381c Belt-like region
382 Sloped surface 382a Reflection surface
383 Sloped surface
383a Reflection surface
384 Top face
384a Entrance portion
386, 387 Upright surface
389 Projecting portion
389a Lower surface
391 Entrance lens surface
392 Output lens surface
400 Lens unit
401 Incidence surface
402 Output surface
500 Sensor IC
501 Photodetecting surface
600 Substrate
700 Housing
710, 720 Recessed portion
711 Light source chamber
712 Support region
713, 714 Support surface
715 Elevated portion
716 Groove
717 Terminal slot
718 Slit
718a, 718b Sloped surface
718c Horizontal surface
718d Sloped surface
719 Wall portions
800 Transmission plate
810 Light shielding layer (Light shielding member)
890 Object to be read

The invention claimed is:

1. An image sensor module comprising:
a light source unit that emits a linear light beam elongate in a primary scanning direction to an object to be read;
a lens unit including an incidence surface and an output surface oriented opposite to each other, the lens unit being configured to receive light from the object through the incidence surface and output the light through the output surface;
a sensor IC that receives the light outputted from the output surface;
a housing that holds the light source unit and the lens unit; and
a support member that supports the lens unit such that the incidence, surface is located more distant from the sensor IC than the output surface in a secondary scanning direction;
wherein the support member includes a primary reflection surface that reflects the light from the object toward the incidence surface.

2. The image sensor module according to claim 1, wherein the reflection surface is located so as to overlap the lens unit as viewed in the secondary scanning direction.

3. The image sensor module according to claim 2, wherein the lens unit is supported such that an optical axis of the lens unit is aligned with the secondary scanning direction.

4. The image sensor module according to claim 3, wherein the support member includes a bottom face perpendicular to a thickness direction orthogonal to both of the primary scanning direction and the secondary scanning direction, and
the housing includes a support region provided with a support surface held in contact with the bottom face.

5. The image sensor module according to claim 4, wherein the support member includes: a transmissive portion provided with a primary sloped surface inclined so as to be closer to the light source unit in the secondary scanning direction as proceeding away from the bottom face in the thickness direction; and a non-transmissive layer formed so as to cover the sloped surface; and
the reflection surface is located at an interface between the transmissive portion and non-transmissive layer.

6. The image sensor module according to claim 5, wherein the transmissive portion is formed integrally with the lens unit so as to cover the lens unit.

7. The image sensor module according to claim 6, wherein the housing includes an elevated portion protruding in the thickness direction from the support surface, and
the elevated portion is in contact with the non-transmissive layer.

8. The image sensor module according to claim 6, wherein the support region includes a groove penetrating therethrough in the thickness direction, the groove being formed at a position overlapping the sensor IC as viewed in the thickness direction, and
the support member includes an additional reflection surface formed so as to overlap the sensor IC as viewed in the thickness direction.

9. The image sensor module according to claim 8, wherein the transmissive portion includes: an additional sloped surface formed opposite to the primary sloped surface in the secondary scanning direction and inclined so as to be closer to the light source unit as proceeding away from the bottom face in the thickness direction; and an additional non-transmissive layer formed so as to cover the additional sloped surface; and
the additional reflection surface is located at the interface between the additional sloped surface and the additional non-transmissive layer.

10. The image sensor module according to claim 1, wherein the housing has a thickness direction orthogonal to both of the primary scanning direction and the secondary scanning direction, the housing supporting the support member,
the support member includes a bottom face held in contact with the housing and a primary upright surface erected from the bottom face and extending in the primary scanning direction, and
the reflection surface is inclined with respect to the upright surface.

11. The image sensor module according to claim 10, wherein the upright surface is in contact with the housing.

12. The image sensor module according to claim 10, wherein the support member includes an additional upright surface erected from the bottom face and extending in the primary scanning direction, and
the additional upright surface is located opposite to the primary upright surface across the lens unit in the secondary scanning direction.

13. The image sensor module according to claim 12, wherein the support member includes an additional reflection surface that reflects the light from the output surface, and
the lens unit is located between the primary reflection surface and the additional reflection surface in the secondary scanning direction.

14. The image sensor module according to claim 1, further comprising a sensor IC support base supporting the sensor IC and fixed to the support member.

15. The image sensor module according to claim 14, wherein the support member includes a recessed portion in which the sensor IC is placed.

16. The image sensor module according to claim 15, further comprising an anti-reflection member located inside the recessed portion.

17. The image sensor module according to claim 1, wherein the support member includes a recessed portion extending in the primary scanning direction and recessed away from the sensor IC, and the housing includes a pair of wall portions extending in the primary scanning direction and fitted in the recessed portion, and a slit formed between the pair of wall portions and facing the sensor IC.

18. The image sensor module according to claim 17, wherein the slit includes a pair of primary sloped surfaces extending in the primary scanning direction and inclined so as to be more distant from each other in the secondary scanning direction as proceeding toward the sensor IC in a thickness direction orthogonal to both of the primary scanning direction and the secondary scanning direction.

19. The image sensor module according to claim 18, wherein the slit includes a pair of additional sloped surfaces extending in the primary scanning direction and inclined so as to be closer to each other in the secondary scanning direction as proceeding toward the sensor IC in the thickness direction orthogonal to both of the primary scanning direction and the secondary scanning direction, and the pair of additional sloped surfaces is located, more distant from the sensor IC than the pair of primary sloped surfaces in the thickness direction.

20. The image sensor module according to claim 19, wherein the slit includes a pair of horizontal surfaces extending in the primary scanning direction and perpendicular to the thickness direction, and each of the horizontal surfaces is located between one of the pair of primary sloped surfaces and one of the pair of additional sloped surfaces.

21. The image sensor module according to claim 20, wherein the sensor IC includes a photodetecting surface perpendicular to the thickness direction, and the pair of horizontal surfaces is oriented in a same direction as the photodetecting surface.

22. The image sensor module according to claim 20, wherein the sensor IC includes a photodetecting surface perpendicular to the thickness direction, and the pair of horizontal surfaces is configured to face the photodetecting surface.

23. The image sensor module according to claim 1, wherein the housing includes a slit facing the sensor IC, and the support member includes a projecting portion extending into the slit.

24. The image sensor module according to claim 1, further comprising a light shielding member that covers the support member in a manner such that at least the reflection surface is exposed.

25. The image sensor module according to claim 24, wherein the housing has a thickness direction orthogonal to both of the primary scanning direction and the secondary scanning direction and supports the support member, the support member includes a bottom face supported by the housing and a primary sloped surface inclined with respect to the bottom face, the light shielding member includes a sloped surface anti-reflection portion held close contact with a part of the sloped surface, and the reflection surface is a portion uncovered with the sloped surface anti-reflection portion of the sloped surface and an interface with air.

26. The image sensor module according to claim 25, wherein the light shielding member includes a bottom face anti-reflection portion held in close contact with the bottom face.

27. The image sensor module according to claim 25, wherein the support member includes a top face opposite to the bottom face in the thickness direction, and the light shielding member includes a top face cover portion that covers the top face.

28. The image sensor module according to claim 25, wherein the support member includes an additional sloped surface inclined with respect to the bottom face, the lens unit is located between the primary sloped surface and the additional sloped surface in the secondary scanning direction, and the light shielding member includes an additional sloped surface anti-reflection portion disposed in close contact with a part of the additional sloped surface.

29. The image sensor module according to claim 1, wherein the support member includes a cavity elongate in the primary scanning direction, and the lens unit is fitted in the cavity.

30. The image sensor module according to claim 1, wherein the support member includes a recessed portion formed so as to recede in the thickness direction orthogonal to both of the primary scanning direction and the secondary scanning direction, and the lens unit is fitted in the recessed portion.

31. The image sensor module according to claim 1, further comprising a substrate on which the sensor IC is mounted, wherein the light source unit includes: an LED module provided with at least one LED chip, at least one lead on which the LED chip is mounted, and a resin package covering a part of the lead and including an opening through which the LED chip is exposed; and a light guide elongate in the primary scanning direction as a whole and including an incidence surface facing the opening, a reflection surface that reflects light from the incidence surface, and an output surface that outputs the light from the reflection surface in a form of a linear light beam elongate in the primary scanning direction, and the lead includes a terminal portion sticking out through the resin package in the thickness direction, extending from a position retracted in the secondary scanning direction with respect to the opening.

32. The image sensor module according to claim 31, wherein the substrate and at least a part of the light guide are deviated from each other as viewed in the secondary scanning direction.

* * * * *